(12) United States Patent
Hirakata et al.

(10) Patent No.: US 8,217,572 B2
(45) Date of Patent: Jul. 10, 2012

(54) DISPLAY DEVICE WITH PRISM LAYER

(75) Inventors: Yoshiharu Hirakata, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 980 days.

(21) Appl. No.: 11/548,035

(22) Filed: Oct. 10, 2006

(65) Prior Publication Data

US 2007/0085476 A1 Apr. 19, 2007

(30) Foreign Application Priority Data

Oct. 18, 2005 (JP) .................................. 2005-303770

(51) Int. Cl.
*H01J 1/62* (2006.01)
*H01J 63/04* (2006.01)

(52) U.S. Cl. ........ 313/506; 313/483; 313/504; 313/505; 313/112; 313/110; 313/113; 313/114; 313/500

(58) Field of Classification Search .................. None
See application file for complete search history.

(56) References Cited

U.S. PATENT DOCUMENTS

| 5,928,801 | A * | 7/1999 | Broer et al. ................ 428/690 |
| 6,233,029 | B1 * | 5/2001 | Iijima et al. .................. 349/96 |
| 7,012,365 | B2 | 3/2006 | Adachi et al. |
| 7,339,316 | B2 | 3/2008 | Adachi et al. |
| 7,872,414 | B2 * | 1/2011 | Sugita et al. ................ 313/506 |
| 2002/0000772 | A1 * | 1/2002 | Kitahara ...................... 313/503 |
| 2002/0093284 | A1 | 7/2002 | Adachi et al. |
| 2004/0189167 | A1 * | 9/2004 | Adachi et al. ................ 313/112 |
| 2004/0227698 | A1 | 11/2004 | Yamazaki et al. |
| 2005/0034810 | A1 | 2/2005 | Yamazaki et al. |
| 2005/0035353 | A1 | 2/2005 | Adachi et al. |
| 2005/0127820 | A1 | 6/2005 | Yamazaki et al. |
| 2005/0151830 | A1 | 7/2005 | Yamazaki |
| 2005/0162355 | A1 | 7/2005 | Yamazaki |
| 2005/0194896 | A1 * | 9/2005 | Sugita et al. ................. 313/506 |
| 2008/0143253 | A1 | 6/2008 | Adachi et al. |
| 2009/0170227 | A1 | 7/2009 | Yamazaki et al. |

FOREIGN PATENT DOCUMENTS

| CN | 1165565 A | 11/1997 |
| CN | 1175704 A | 3/1998 |
| CN | 1368656 A | 9/2002 |
| CN | 1630443 A | 6/2005 |

(Continued)

OTHER PUBLICATIONS

Office Action (Chinese Patent Application No. 200610135626.9) mailed Jun. 5, 2009; with full English translation; 21 pages.

*Primary Examiner* — Natalie Walford
(74) *Attorney, Agent, or Firm* — Fish & Richardson P.C.

(57) ABSTRACT

It is an object to propose a display device in which reflection of external light on a reflective polarizing plate is prevented and also extraction efficiency of light from a light-emitting layer is improved. If the display device has a light-emitting layer provided over a reflective electrode, a transparent electrode provided over the light-emitting layer, a transparent substrate provided over the transparent electrode, a reflective polarizing plate provided over the transparent substrate, a quarter wave plate provided over the reflective polarizing plate, and a polarizing plate provided over the quarter wave plate, reflection of an outside image can be suppressed, and light emitted in the light-emitting layer can be extracted efficiently.

13 Claims, 11 Drawing Sheets

FOREIGN PATENT DOCUMENTS

| | | |
|---|---|---|
| EP | 0 825 477 A2 | 2/1998 |
| EP | 1 223 618 A2 | 7/2002 |
| JP | 11-045058 | 2/1999 |
| JP | 2001-357979 | 12/2001 |
| JP | 2003315548 A | 11/2003 |
| JP | 2004226686 A | 8/2004 |
| JP | 2004307976 A | 11/2004 |
| JP | 2005-063841 | 3/2005 |
| JP | 2005-100789 | 4/2005 |
| WO | WO 97/12276 A1 | 4/1997 |

* cited by examiner

DISPLAY DEVICE WITH PRISM LAYER

BACKGROUND OF THE INVENTION

1. Field of the Invention

The present invention relates to a display device in which an element having a structure including an anode, a cathode, and a thin film which emits light by electroluminescence (hereinafter, referred to as "EL") interposed between the anode and the cathode is provided over a substrate.

2. Description of the Related Art

An EL element is an element which obtains light emission by forming a thin film containing an organic compound or an inorganic compound, or a crystal between a cathode and an anode and feeding current between the cathode and the anode. In recent years, especially an EL element in which a thin film containing an organic compound as its main constituent (hereinafter, referred to as a light-emitting layer) is placed between a cathode and an anode, i.e., an organic EL element, has been actively developed.

An organic EL element is expected to be applied in various fields, and is considered to be applied not only to a lighting apparatus but also to a display or the like used for a mobile phone or a personal computer. The organic EL element is manufactured by interposing a material which emits light by feeding current between a pair of electrodes. The organic EL element emits light by itself, and thus does not need a light source such as a backlight, differently from a liquid crystal. Also, the element itself is extremely thin. Therefore, the organic EL element has a great advantage in manufacturing a thin and lightweight display.

For example, as such a display, a display device is proposed, in which an organic EL element using metal having high reflexivity for a cathode and a transparent electrode for an anode is provided over a substrate. By using the metal having high reflexivity for the cathode, emission luminance from a light-emitting layer can be enhanced; however, on the other hand, there is a problem that an outside image is reflected when external light is reflected on the metal surface, which causes deterioration of image display characteristics, for example a viewer has difficulty in seeing a display image and brightness of the display image gets dark. In order to solve the problem, there is a proposed method of suppressing reflection of an outside image (or outside light) by providing antireflection means. For example, a display device (Patent Document 1: Japanese Published Patent Application No. 2005-100789) provided with antireflection means including a quarter wave plate, a reflective polarizing plate, and an absorptive polarizing plate, or a display device (Patent Document 2: Japanese Published Patent Application No. H11-45058) provided with antireflection means including a wavelength correcting plate, a plane linear polarization beam splitter, and a polarizing plate is disclosed.

However, in the display device provided with antireflection means including a quarter wave plate, a reflective polarizing plate, and an absorptive polarizing plate, or the display device provided with antireflection means including a wavelength correcting plate, a plane linear polarization beam splitter, and a polarizing plate, there are possibilities not only that reflection of an outside image when external light is reflected on a cathode surface cannot be suppressed, but also that part of external light which enters the display device does not pass through the reflective polarizing plate or the plane linear polarization beam splitter and is reflected on the surface, and accordingly, the reflection of the outside image cannot be eliminated completely.

SUMMARY OF THE INVENTION

It is an object of the present invention to propose a display device in which reflection of external light on a reflective polarizing plate is prevented and also extraction efficiency of light from a light-emitting layer is enhanced.

One feature of the present invention is a display device having a light-emitting layer provided over a reflective electrode, a transparent electrode provided over the light-emitting layer, a reflective polarizing plate provided over the transparent electrode, a quarter wave plate provided over the reflective polarizing plate, and a polarizing plate provided over the quarter wave plate.

Another feature of the present invention is a display device having a transparent electrode, a light-emitting layer, and a reflective electrode over one surface of a substrate, and a reflective polarizing plate, a quarter wave plate, and a polarizing plate over the other surface of the substrate, where the quarter wave plate is provided between the reflective polarizing plate and the polarizing plate.

Another feature of the present invention is a display device having a transparent electrode, a light-emitting layer, and a reflective electrode over one surface of a transparent substrate, and a reflective polarizing plate, a broadband quarter wave plate having an effect as a quarter wave plate in a range of visible light, and a polarizing plate over the other surface of the transparent substrate, where the broadband quarter wave plate is provided between the reflective polarizing plate and the polarizing plate.

Another feature of the present invention is a display device having a light-emitting layer provided over a reflective electrode, a transparent electrode provided over the light-emitting layer, a substrate provided over the transparent electrode, a reflective polarizing plate provided over the substrate, a quarter wave plate provided over the reflective polarizing plate, and a polarizing plate provided over the quarter wave plate.

Another feature of the present invention is a display device having a reflective electrode provided over a substrate, a light-emitting layer provided over the reflective electrode, a transparent electrode provided over the light-emitting layer, a reflective polarizing plate provided over the transparent electrode, a quarter wave plate provided over the reflective polarizing plate, and a polarizing plate provided over the quarter wave plate.

Another feature of the present invention is a display device having a first quarter wave plate provided over a first polarizing plate, a first reflective polarizing plate provided over the first quarter wave plate, a substrate provided over the reflective polarizing plate, a first transparent electrode provided over the substrate, a light-emitting layer provided over the first transparent electrode, a second transparent electrode provided over the light-emitting layer, a second reflective polarizing plate provided over the second transparent electrode, a second quarter wave plate provided over the second reflective polarizing plate, and a second polarizing plate provided over the second quarter wave plate.

Another feature of the present invention is a display device having a quarter wave plate provided over a polarizing plate, a reflective polarizing plate provided over the quarter wave plate, a substrate provided over the reflective polarizing plate, a thin film transistor having a semiconductor film including a source region or a drain region, which is provided over the substrate, an interlayer insulating film having a contact hole reaching the source region or the drain region, which is provided over the thin film transistor, a wiring electrically connected to the source region or the drain region, which is provided over the interlayer insulating film, a transparent electrode provided over the interlayer insulating film and the wiring, a light-emitting layer provided over the transparent electrode, and a reflective electrode provided over the light-emitting layer.

Another feature of the present invention is a display device having a thin film transistor having a semiconductor film including a source region or a drain region, which is provided over a substrate, an interlayer insulating film having a contact hole reaching the source region or the drain region, which is provided over the thin film transistor, a wiring electrically connected to the source region or the drain region, which is provided over the interlayer insulating film, a reflective electrode provided over the interlayer insulating film and the wiring, a light-emitting layer provided over the reflective electrode, a transparent electrode provided over the light-emitting layer, a reflective polarizing plate provided over the transparent electrode, a quarter wave plate provided over the reflective polarizing plate, and a polarizing plate provided over the quarter wave plate.

Another feature of the present invention is a display device having a first quarter wave plate provided over a first polarizing plate, a first reflective polarizing plate provided over the first quarter wave plate, a substrate provided over the first reflective polarizing plate, a thin film transistor having a semiconductor film including a source region or a drain region, which is provided over the substrate, an interlayer insulating film having a contact hole reaching the source region or the drain region, which is provided over the thin film transistor, a wiring electrically connected to the source region or the drain region, which is provided over the interlayer insulating film, a first transparent electrode provided over the interlayer insulating film and the wiring, a light-emitting layer provided over the first transparent electrode, a second transparent electrode provided over the light-emitting layer, a second reflective polarizing plate provided over the second transparent electrode, a second quarter wave plate provided over the second reflective polarizing plate, and a second polarizing plate provided over the second quarter wave plate.

Another feature of the present invention is a display device in which a prism is formed between the substrate and the reflective polarizing plate.

Another feature of the present invention is a display device having a transparent electrode, a light-emitting layer, and a reflective electrode over one surface of a substrate, and a first quarter wave plate, a reflective polarizing plate, a second quarter wave plate, and a polarizing plate over the other surface of the substrate.

Another feature of the present invention is a display device having a light-emitting layer provided over a reflective electrode, a transparent electrode provided over the light-emitting layer, a substrate provided over the transparent electrode, a first quarter wave plate provided over the substrate, a reflective polarizing plate provided over the first quarter wave plate, a second quarter wave plate provided over the reflective polarizing plate, and a polarizing plate provided over the second quarter wave plate.

Another feature of the present invention is a display device having a second quarter wave plate provided over a polarizing plate, a reflective polarizing plate provided over the second quarter wave plate, a first quarter wave plate provided over the reflective polarizing plate, a substrate provided over the first quarter wave plate, a thin film transistor having a semiconductor film including a source region or a drain region, which is provided over the substrate, an interlayer insulating film having a contact hole reaching the source region or the drain region, which is provided over the thin film transistor, a wiring electrically connected to the source region or the drain region, which is provided over the interlayer insulating film, a transparent electrode provided over the interlayer insulating film and the wiring, a light-emitting layer provided over the transparent electrode, and a reflective electrode provided over the light-emitting layer.

Another feature of the present invention is a display device in which a prism is formed between the substrate and the first quarter wave plate.

Another feature of the present invention is a display device in which the quarter wave plate, the first quarter wave plate, or the second quarter wave plate is a broadband quarter wave plate.

Another feature of the present invention is an electronic apparatus having the display device.

In the present invention, reflection of an outside image when external light is reflected on a reflective polarizing plate can be suppressed, and display characteristics of an image can be improved. In addition, light emitted in a light-emitting layer can be extracted efficiently, and decrease in brightness of a display image can be suppressed.

DETAILED DESCRIPTION OF THE INVENTION

Figure 1A:
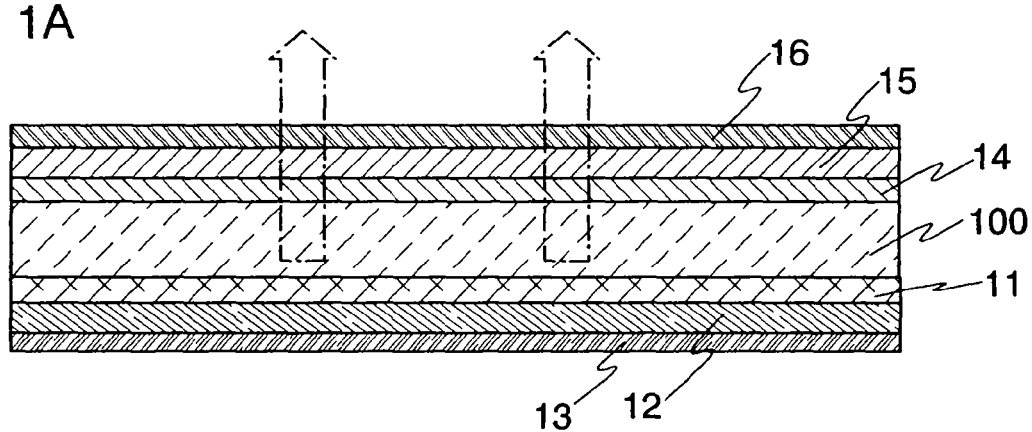
FIGS. 1A and 1B are schematic cross-sectional views each showing a display device.

A best mode for carrying out the present invention will be explained with reference to drawings. However, the present invention is not limited to the modes below, and it is easily understood by those skilled in the art that the modes and details can be modified in various ways without departing from the purpose and the scope of the present invention. Therefore, the present invention is not interpreted as being limited to the description of the embodiment modes to be given below. It is to be noted that, in the structure hereinafter explained, the reference numerals denoting the same portions are used in common in different drawings and the repeated explanation is omitted. In addition, following Embodiment Modes 1 to 7 can be freely combined with each other to be used.

It is to be noted that, in the present specification, an axis of polarizing axes of a polarizing plate or a reflective polarizing plate, which transmits light, is referred to as a transmission axis. Also, an axis of the polarizing axes of the polarizing plate, which absorbs light, is referred to as an absorption axis. It is to be noted that the transmission axis and the absorption axis cross at right angles. Such an absorptive polarizing plate having an absorption axis is simply referred to as a polarizing plate. In addition, a polarizing plate having a function of transmitting light of a particular polarization component and reflecting light of other polarization component is referred to as a reflective polarizing plate.

Here, a linear polarization reflective polarizing plate or a circular polarization reflective polarizing plate can be used as the reflective polarizing plate. In the present specification, the linear polarization reflective polarizing plate indicates a plate which has properties of transmitting one polarization component of linear polarization and reflecting other polarization component (that is, properties of transmitting and reflecting any of components of the linear polarization such as a P wave and an S wave, for example transmitting the P wave component and reflecting the S wave component). The circular polarization reflective polarizing plate indicates a plate which has properties of transmitting a component with one rotation direction among right-hand circular polarization and left-hand circular polarization and reflecting the other component. As the linear polarization reflective polarizing plate, a multilayer film in which transparent layers each having different refractive index are stacked, or the like can be used, for example. Also, as the circular polarization reflective polarizing plate, a substance having a cholesteric layer, or the like can be used, for example.

In addition, in the present specification, a combination of a half wave plate and a quarter wave plate may also be used instead of a quarter wave plate. Moreover, in the present specification, a broadband quarter wave plate having an effect as a quarter wave plate in a range of visible light (preferably, 380 to 780 nm) is also referred to as a quarter wave plate.

Embodiment Mode 1

Figure 1B:
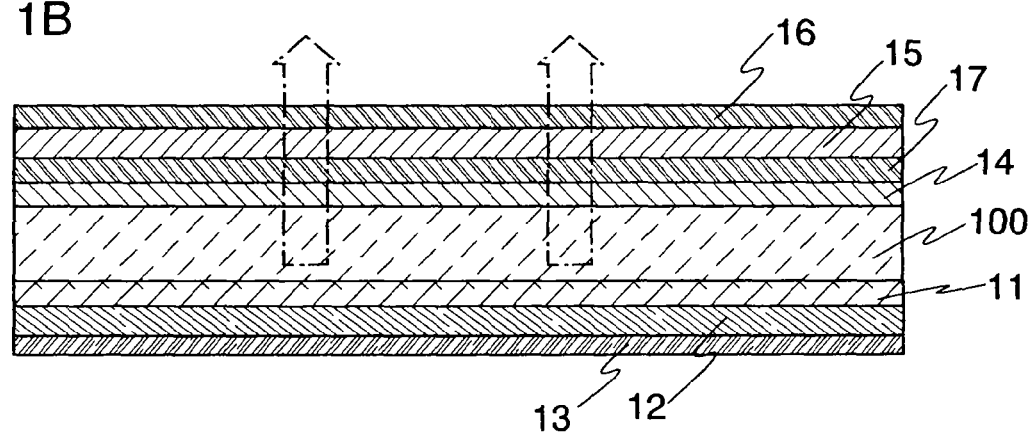

In this embodiment mode, a display device having a reflective polarizing plate, a quarter wave plate, and a polarizing plate will be explained. In FIGS. 1A and 1B, part of the display device of this embodiment mode is shown. It is to be noted that this structure is effective for displays such as PDP, SED, and FED as well as an organic EL display or an inorganic EL display.

In the display device of this embodiment mode, as shown in FIGS. 1A and 1B, a transparent electrode 11, a light-emitting layer 12, and a reflective electrode 13 are stacked over a substrate 100, and a reflective polarizing plate 14, a quarter wave plate 15, and a polarizing plate 16 are stacked over a surface of the substrate 100, which is opposite to the surface provided with the transparent electrode 11. In other words, the display device has a structure in which the reflective electrode 13, the light-emitting layer 12, the transparent electrode 11, the substrate 100, the reflective polarizing plate 14, the quarter wave plate 15, and the polarizing plate 16 are sequentially stacked. In this embodiment mode, a structure in which light emission from the light-emitting layer 12 is extracted from the transparent electrode 11 side (the substrate 100 side) is employed, and light emission can be obtained by feeding current between the transparent electrode 11 and the reflective electrode 13.

The polarizing plate 16 has functions of transmitting a linear polarization component having a vibrating surface which is parallel to its transmission axis and absorbing a linear polarization component having a vibrating surface which crosses the transmission axis at right angles.

In this embodiment mode, in a case of using a linear polarization reflective polarizing plate as the reflective polarizing plate, a transmission axis of the reflective polarizing plate 14 and a slow axis of the quarter wave plate 15 are arranged so as to have an angle of 45° or 135° between them. Also, in a case of using the linear reflective polarizing plate, the transmission axis of the reflective polarizing plate 14 and a transmission axis of the polarizing plate 16 are arranged so as to be parallel to each other.

In this embodiment mode, since a structure in which light emission from the light-emitting layer 12 is extracted through the substrate 100 is employed, the substrate 100 needs to be a transparent substrate. As the substrate 100, a glass substrate, a quartz substrate, a flexible substrate, or the like can be used, for example. The flexible substrate means a substrate which can be bent, and a plastic substrate or the like which is formed of polyimide, acrylic, polyethylene terephthalate, polycarbonate, polyarylate, or polyether sulfone, or the like can be given, for example. In addition, a thin film-formed substrate formed of polypropylene, polyester, vinyl, polyvinyl fluoride, vinyl chloride, or the like can also be used. A planarizing film may be applied to these substrates as needed, or a nitride film, an oxide film, or a stacked film of these films may be formed. Alternatively, these substrates may be used after being polished by CMP or the like.

As the transparent electrode 11, indium tin oxide (ITO), indium tin oxide containing silicon oxide (ITSO), zinc oxide (ZnO), indium zinc oxide (IZO) which is formed using a target in which 2 to 20 wt % of zinc oxide (ZnO) is further mixed with indium oxide containing silicon oxide, zinc oxide containing gallium (GZO), tin oxide ($SnO_2$), indium oxide ($In_2O_3$), or the like can be used.

The light-emitting layer 12 contains a light-emitting substance. For example, the light-emitting layer 12 has a structure in which a hole transporting layer, a light-emitting layer, and an electron transporting layer are sequentially stacked over the transparent electrode 11. The structure of the light-emitting layer 12 is not limited thereto, and it is acceptable as long as the structure has at least a light-emitting layer. Besides the light-emitting layer, for example, functional layers such as an electron injecting layer, an electron transporting layer, a hole blocking layer, a hole transporting layer, and a hole injecting layer may be freely combined with each other. It is to be noted that since the transparent electrode 11 serves as an anode in this embodiment mode, the hole injecting layer, the hole transporting layer, the hole blocking layer, the light-emitting layer, the electron transporting layer, and the electron injecting layer are sequentially stacked from the transparent electrode 11 side. In addition, a mixed layer or a mixed junction of the above layers may also be formed. It is to be noted that a boundary between layers is not necessarily clear, and there is a case where materials forming adjacent layers are partially mixed and the boundary between the layers is unclear. An organic material and an inorganic material can be used for each layer. As the organic material, any of materials of high molecular, middle molecular, and low molecular can be used. Further, the middle molecular material corresponds to a low polymer in which the number of repeated structural units (the degree of polymerization) is approximately 2 to 20.

As the reflective electrode 13, highly reflective metal (e.g., metal having reflectivity of 40% or more) is preferably used. For example, aluminum (Al), silver (Ag), an AlLi alloy and a MgAg alloy which are alloys containing the metal, and the like can be used. In addition, the reflective electrode 13 may have a stacked structure of highly reflective metal and other electrode material. An electron injecting property can be enhanced by forming a thin film of alkali metal or alkali earth metal (e.g., approximately 5 nm), and stacking the film and highly reflective metal.

Here, a case where the reflective polarizing plate 14 is a linear polarization reflective polarizing plate is explained. First, an optical component (referred to as first polarization) of external light which enters from an observation surface of a display device, i.e., an upper side of the polarizing plate 16, which is parallel to an absorption axis of the polarizing plate 16, is absorbed in the polarizing plate 16, and second polarization which is parallel to a transmission axis of the polarizing plate 16 enters the display device. The second polarization is converted to right-hand or left-hand circular polarization by passing through the quarter wave plate 15. In this embodiment mode, a case where the second polarization is converted to the right-hand circular polarization is considered. A polarization component of the second polarization converted to right-hand circular polarization, which does not coincide with a transmission axis of the reflective polarizing plate 14, is reflected on the reflective polarizing plate 14 and returns to the quarter wave plate 15 as left-hand circular polarization. The left-hand circular polarization is converted to third polarization having a polarizing axis which is perpendicular to a polarizing axis of the second polarization by passing through the quarter wave plate 15. In other words, the third polarization has a polarizing axis which is parallel to the absorption axis of the polarizing plate 16. Similarly, in a case of the left-hand circular polarization, third polarization having a polarizing axis which is parallel to the absorption axis of the polarizing plate 16 is emitted. Therefore, the third polarization is absorbed without passing through the polarizing plate 16.

In addition, a polarization component of the second polarization, which coincides with a transmission axis of the reflective polarizing plate 14, passes through the reflective polarizing plate 14. Then, the polarization component is reflected on the reflective electrode 13 and passes through the reflective polarizing plate 14 again, and thereafter, is converted to fourth polarization having a polarization component which is perpendicular to the polarizing axis of the second polarization by passing through the quarter wave plate 15. Since the fourth polarization coincides with the absorption axis of the polarizing plate 16, the fourth polarization is absorbed without passing through the polarizing plate 16. Therefore, a component of external light which enters the display device is absorbed in the polarizing plate 16, and the external light is not emitted outside again; therefore, reflection of an outside image can be suppressed.

On the other hand, a polarization component of light emitted in the light-emitting layer 12, which is parallel to the transmission axis of the reflective polarizing plate 14 passes through the reflective polarizing plate 14, becomes circular polarization through the quarter wave plate 15, and light having the same component as that of the transmission axis passes through the polarizing plate 16 to be emitted outside the display device. The other polarization component is reflected on the reflective polarizing plate 14 to return in a direction of the light-emitting layer 12, and is reflected on the reflective electrode 13 to enter the reflective polarizing plate 14 again. Here, light having a polarizing axis which is not parallel to the polarizing axis of the reflective polarizing plate 14 is repeatedly reflected between the reflective polarizing plate 14 and the reflective electrode 13. By being repeatedly reflected, the polarizing axis is displaced, the polarizing axis of the repeatedly reflected light becomes parallel to the polarizing axis of the reflective polarizing plate 14, and the light is emitted from the display device by passing through the reflective polarizing plate 14, the quarter wave plate 15, and the polarizing plate 16. Therefore, a light emission component which has not conventionally been able to be used can be utilized effectively, and enhancement of brightness of a display image can be attempted.

A polarizing plate 17 may be additionally provided between the reflective polarizing plate 14 and the quarter wave plate 15 (FIG. 1B). In that case, the polarizing plate 17 is arranged so that a transmission axis of the polarizing plate 17 coincides with that of the polarizing plate 16. By providing the polarizing plate 17, polarization of the second polarization converted in the right-hand circular polarization, which does not coincide with the transmission axis of the reflective polarizing plate 14 and is reflected on the reflective polarizing plate 14, is absorbed in the polarizing plate 17; therefore, external light is not emitted outside again. Thus, reflection of an outside image can be suppressed more effectively.

In addition, a case where the reflective polarizing plate 14 is a circular polarization reflective polarizing plate is explained. First, an optical component (referred to as first polarization) of external light which enters from an observation surface of the display device, i.e., an upper side of the polarizing plate 16, which is parallel to an absorption axis of the polarizing plate 16, is absorbed in the polarizing plate 16, and second polarization which is parallel to a transmission axis of the polarizing plate 16 enters the display device. The second polarization is converted to right-hand or left-hand circular polarization by passing through the quarter wave plate 15. In this embodiment mode, a case where the second polarization is converted to the right-hand circular polarization is considered. Here, the reflective polarizing plate 14 has functions of transmitting a left-hand circular polarization component and reflecting a right-hand circular polarization component. The second polarization converted to right-hand circular polarization is reflected on the reflective polarizing plate 14, returns to the quarter wave plate 15, and passes through the quarter wave plate 15; accordingly, the second polarization is converted to third polarization having a polarizing axis which is perpendicular to the polarizing axis of the second polarization. In other words, the third polarization has a polarizing axis which is parallel to the absorption axis of the polarizing plate 16. Here, in a case where the second polarization is converted to left-hand circular polarization at the quarter wave plate 15, the reflective polarizing plate 14 having functions of transmitting right-hand circular polarization and reflecting left-hand circular polarization is used so that the second polarization is converted to the third polarization having a polarizing axis which is parallel to the absorption axis of the polarizing plate 16. Therefore, a component of external light which enters the display device is absorbed in the polarizing plate 16, and the external light is not emitted outside again. Thus, reflection of an outside image can be suppressed.

On the other hand, a circular polarization component of light emitted in the light-emitting layer 12 which does not coincide with a spiral rotation direction of a cholesteric layer of the reflective polarizing plate passes through the reflective polarizing plate 14, the quarter wave plate 15, and the polarizing plate 16, and emitted from the display device. In addition, a circular polarization component which coincides with the spiral rotation direction is reflected on the reflective polarizing plate 14 to return in a direction of the light-emitting layer 12, and is reflected on the reflective electrode 13 to enter the reflective polarizing plate 14 again. Here, polarization which does not pass through the reflective polarizing plate 14 is repeatedly reflected between the reflective polarizing plate 14 and the reflective electrode 13. By the repetition reflection, the polarizing axis is displaced, repeatedly reflected light passes through the reflective polarizing plate 14, the quarter wave plate 15, and the polarizing plate 16, and is emitted from the display device. Therefore, a light emission component which has not conventionally been able be to be used can be utilized effectively, and enhancement of brightness of a display image can be attempted.

In this embodiment mode, an antireflection film, a non-antireflection film, or the like may be provided. The antireflection film suppresses reflection of external light on a surface by stacking thin films each having different refractive index, or the like. By providing the antireflection film, the reflection of external light on the surface of the polarizing plate 16 can be suppressed, and further, reflection of an outside image can be suppressed.

Also, by using a broadband quarter wave plate which has a function as a quarter wave plate in a range of visible light (preferably, 380 to 780 nm) as the quarter wave plate, a favorable quarter wave characteristic in the visible light range can be obtained, and in addition, not only external light can be made to disappear in a wide range but also light emitted from the light-emitting layer 12 can be extracted efficiently.

In the display device of this embodiment mode, the reflection of an outside imager when external light is reflected on the reflective polarizing plate 14 can be suppressed, and display characteristics of an image can be improved. In addition, light emitted in the light-emitting layer 12 can be extracted efficiently, and improvement in brightness of a display image can be attempted.

Embodiment Mode 2

Figure 2A:
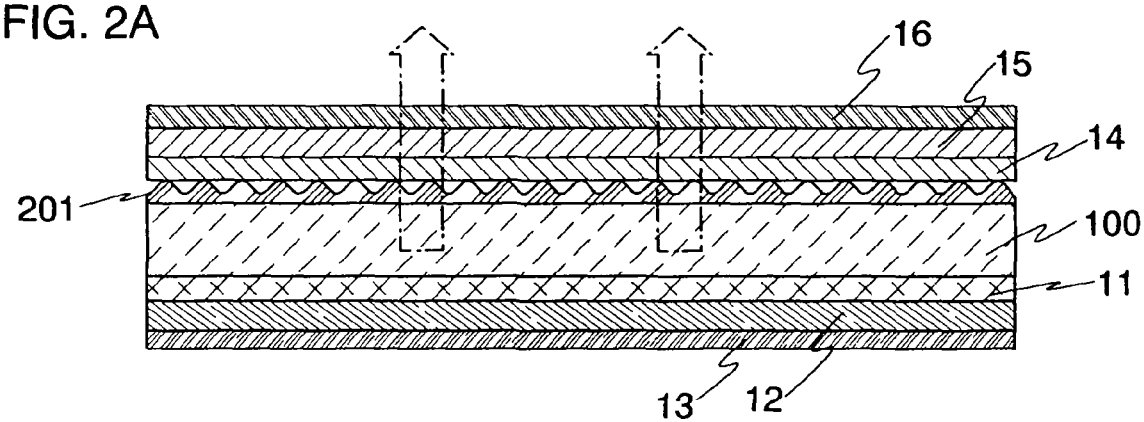
FIGS. 2A and 2B are schematic cross-sectional views each showing a display device.
Figure 2B:
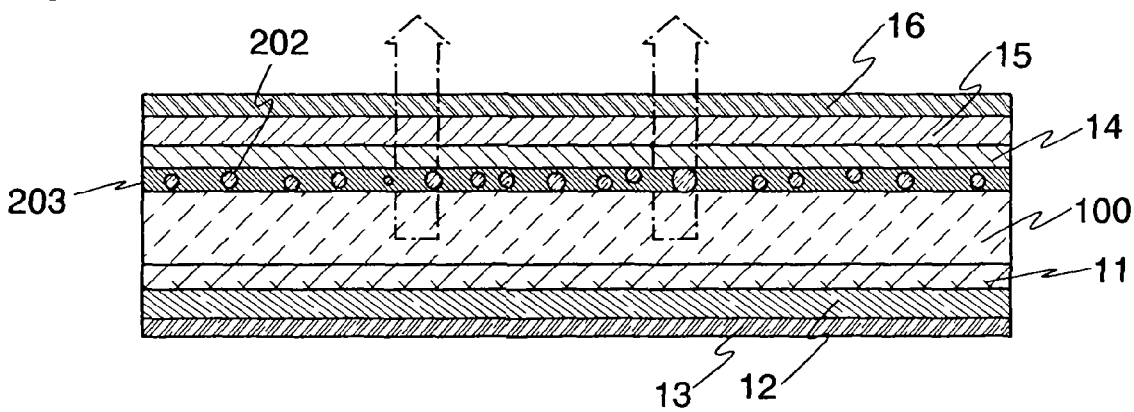

In this embodiment mode, a case where a prism layer is provided between a reflective polarizing plate 14 and a substrate 100 will be explained. It is to be noted that, in FIGS. 2A and 2B, the same portions as those in FIGS. 1A and 1B are denoted by the same reference numerals, and the explanation is omitted. In FIGS. 2A and 2B, part of a display device of this embodiment mode is shown.

In the display device of this embodiment mode, as shown in FIG. 2A, a transparent electrode 11, a light-emitting layer 12, and a reflective electrode 13 are stacked over a substrate 100, and a prism layer 201, a reflective polarizing plate 14, a quarter wave plate 15, and a polarizing plate 16 are sequentially stacked over a surface of the substrate 100, which is opposite to the surface provided with the transparent electrode 11. In other words, the display device has a structure in which the reflective electrode 13, the light-emitting layer 12, the transparent electrode 11, the substrate 100, the prism layer 201, the reflective polarizing plate 14, the quarter wave plate 15, and the polarizing plate 16 are sequentially stacked.

In this embodiment mode, the prism layer 201 is a comb-shaped film material provided in order to displace a polarizing axis of polarization, in which projections are formed in stripe and a cross section in a direction perpendicular to the stripe on the surface is a random size. It is to be noted that, in this embodiment mode, the prism layer 201 is not particularly limited as long as the prism layer is a scattering layer which can displace the polarizing axis of the polarization. As such a scattering layer, a thin film 203 in which a substance (or a particle) 202 formed of materials each having a different size or refractive index are dispersed may be used, for example (FIG. 2B). In addition, both the scattering layer and the prism layer may also be provided.

In this embodiment mode, in a case of using a linear polarization reflective polarizing plate as the reflective polarizing plate, a polarizing axis of the reflective polarizing plate 14 and a slow axis of the quarter wave plate 15 are arranged so as to have an angle of 45° or 135° between them. Also, in a case of using the linear reflective polarizing plate, the transmission axis of the reflective polarizing plate 14 and a transmission axis of the polarizing plate 16 are arranged so as to be parallel to each other.

By this structure, similarly to Embodiment Mode 1, external light which enters the display device is absorbed in the polarizing plate 16, and the external light is not emitted to outside again. Thus, reflection of an outside image can be suppressed.

On the other hand, similarly to Embodiment Mode 1, light emitted in the light-emitting layer 12 is repeatedly reflected between the reflective polarizing plate 14 and the reflective electrode 13; accordingly, the light emitted in the light-emitting layer 12 can be efficiently emitted. Therefore, a light emission component which has not conventionally been able to be used can be utilized effectively, and enhancement of brightness of a display image can be attempted. In this embodiment mode, since the light is repeatedly reflected between the reflective polarizing plate 14 and the reflective electrode 13 through the prism layer 201, the polarizing axis can be efficiently displaced, and extraction efficiency of the light emitted in the light-emitting layer 12 can be more enhanced. One or a plurality of prism layers 201 may be provided as long as the prism layer has a function of not only converging light emission but also changing a direction or a state of polarization which is repeatedly reflected between the reflective polarizing plate 14 and the reflective electrode 13.

In the display device of this embodiment mode, reflection of an outside image when external light is reflected on the reflective polarizing plate 14 can be suppressed, and display characteristics of an image can be improved. In addition, light emitted in the light-emitting layer 12 can be extracted efficiently, and improvement in brightness of a display image can be attempted.

Embodiment Mode 3

Figure 3:
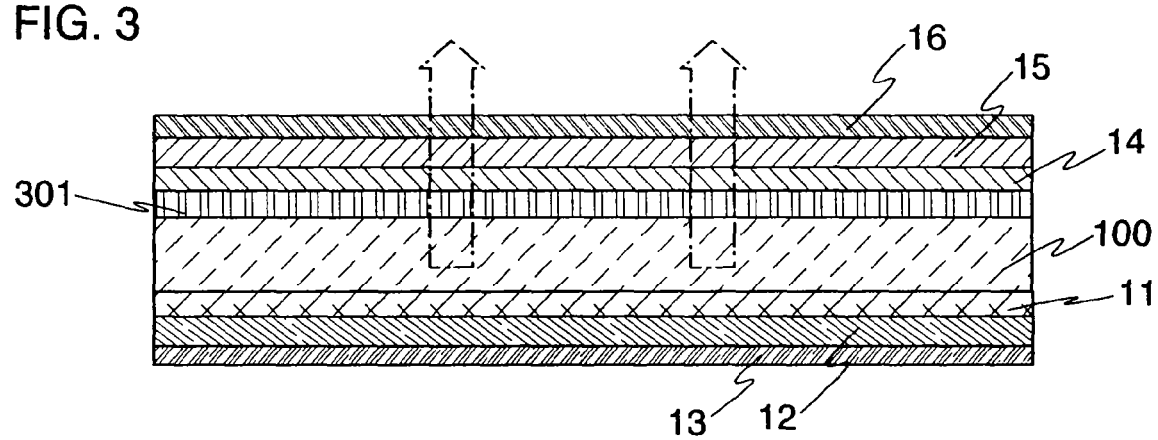
FIG. 3 is a schematic cross-sectional view showing a display device.

In this embodiment mode, a case where a quarter wave plate is provided between a reflective polarizing plate 14 and a substrate 100 will be explained. It is to be noted that, in FIG. 3, the same portions as those in FIGS. 1A and 1B are denoted by the same reference numerals, and the explanation is omitted. In FIG. 3, part of a display device of this embodiment mode is shown.

In the display device of this embodiment mode, as shown in FIG. 3, a transparent electrode 11, a light-emitting layer 12, and a reflective electrode 13 are stacked over the substrate 100, and a quarter wave plate 301 (referred to as a first quarter wave plate), the reflective polarizing plate 14, a quarter wave plate 15 (referred to as a second quarter wave plate), and a polarizing plate 16 are stacked over a surface of the substrate 100, which is opposite to the surface provided with the transparent electrode 11. In other words, the display device has a structure in which the reflective electrode 13, the light-emitting layer 12, the transparent electrode 11, the substrate 100, the quarter wave plate 301, the reflective polarizing plate 14, the quarter wave plate 15, and the polarizing plate 16 are sequentially stacked.

In this embodiment mode, in a case of using a linear polarization reflective polarizing plate as the reflective polarizing plate, a polarizing axis of the reflective polarizing plate 14 and a polarizing axis of the first quarter wave plate 301 are arranged so as to have an angle of 45° or 135° between them. In addition, in a case of using the linear polarization reflective polarizing plate as the reflective polarizing plate 14, a transmission axis of the reflective polarizing plate 14 and a transmission axis of the second quarter wave plate 15 are arranged so as to have an angle of 45° or 135° between them. Moreover, in a case of using the linear polarization reflective polarizing plate, the transmission axis of the reflective polarizing plate 14 and a transmission axis of the polarizing plate 16 are arranged so as to be parallel to each other.

Here, a case where the reflective polarizing plate is the linear polarization reflective polarizing plate is explained. First, a polarization component (referred to as first polarization) of external light which enters from an observation surface of a display device, i.e., an upper side of the polarizing plate 16, which is parallel to an absorption axis of the polarizing plate 16, is absorbed in the polarizing plate 16, and second polarization which is parallel to the transmission axis of the polarizing plate 16 enters the display device. The second polarization is converted to right-hand or left-hand circular polarization by passing through the second quarter wave plate 15. A component of the second polarization, which does not coincide with the transmission axis of the reflective polarizing plate 14, is reflected on the reflective polarizing plate 14, and is absorbed without passing through the polarizing plate 16, similarly to Embodiment Mode 1, and a component of external light, which has entered the display device is not emitted outside again.

A polarization component of the second polarization, which coincides with the transmission axis of the reflective polarizing plate 14, passes through the reflective polarizing plate 14. Thereafter, the polarization component is converted to right-hand or left-hand circular polarization at the first quarter wave plate 301, reflected on the reflective electrode 13, and returns toward the first quarter wave plate 301. Since the circular polarization reflected on the reflective electrode 13 reverses the polarization direction, the polarization which has passed through the first quarter wave plate 301 is reflected on the reflective polarizing plate 14. The reflected light passes through the first quarter wave plate 301 again, becomes circular polarization, and is reflected on the reflective electrode 13 again. The circular polarization passes through the quarter wave plate again; accordingly, the circular polarization becomes linear polarization which coincides with the transmission axis of the reflective polarizing plate 14, is converted to circular polarization at the second quarter wave plate 15, and a component which coincides with the absorption axis of the polarizing plate 16 is absorbed. Although part of the component is emitted, light which is attenuated in the display device is emitted finally. Thus, reflection of an outside image can be suppressed to a degree which does not cause a problem in use.

On the other hand, light emitted in the light-emitting layer 12 is first converted to circular polarization or linear polarization at the first quarter wave plate 301. A polarization component of the converted components, which is parallel to the transmission axis of the reflective polarizing plate 14, passes through the reflective polarizing plate 14, the quarter wave plate 15, and the polarizing plate 16, and emitted from the display device. The other polarization component is reflected on the reflective polarizing plate 14 to return in a direction of the first quarter wave plate 301, and is converted to right-hand or left-hand circular polarization. The right-hand or left-hand circular polarization is reflected on the reflective electrode 13, and enters the first quarter wave plate 301 again as circular polarization in which the polarization direction is reversed. Then, the right-hand or left-hand circular polarization is converted, at the first quarter wave plate 301, to polarization having a polarizing axis which is parallel to the reflective polarizing plate 14, passes through the polarizing plate 16, and is emitted from the display device. Therefore, a light emission component from the light-emitting layer 12 which has not conventionally been able to be used can be utilized efficiently, and enhancement of brightness of a display image can be attempted.

In addition, a case where the reflective polarizing plate is a circular polarization reflective polarizing plate is explained. Here, a case where the reflective polarizing plate 14 has functions of transmitting left-hand circular polarization and reflecting right-hand circular polarization is explained. First, a polarizing component (referred to as first polarization) of external light which enters from an observation surface of a display device, i.e., an upper side of the polarizing plate 16, which is parallel to an absorption axis of the polarizing plate 16, is absorbed in the polarizing plate 16, and second polarization which is parallel to the transmission axis of the polarizing plate 16 enters the display device. The second polarization passes through the quarter wave plate 15, and is converted to right-hand circular polarization, for example; accordingly, similarly to Embodiment Mode 1, the second polarization is absorbed without passing through the polarizing plate 16, and a component of external light which enters the display device is not emitted outside again. Thus, reflection of an outside image can be suppressed.

On the other hand, light emitted in the light-emitting layer 12 is first converted to circular polarization, elliptic polarization, or linear polarization at the first quarter wave plate 301. One circular polarization component of the converted components passes through the reflective polarizing plate 14, the quarter wave plate 15, and the polarizing plate 16, and is emitted from the display device. The other polarization component is reflected on the reflective polarizing plate 14, returns in a direction of the light-emitting layer 12 through the first quarter wave plate 301, is reflected on the reflective electrode 13, and enters the reflective polarizing plate 14 again. Here, polarization which does not pass through the reflective polarizing plate 14 is repeatedly reflected between the reflective polarizing plate 14 and the reflective electrode 13 through the first quarter wave plate 301. By the repeated reflection, a polarizing axis is displaced. The repeatedly reflected light passes through the reflective polarizing plate 14, the quarter wave plate 15, and the polarizing plate 16, and is emitted from the display device. Therefore, a light emission component which has not conventionally been able to be used can be utilized effectively, and enhancement of brightness of a display image can be attempted.

In this embodiment mode, a prism layer, a scattering layer, or a layer in which the prism layer and the scattering layer are combined may also be provided between the substrate 100 and the first quarter wave plate 301.

In the display device of this embodiment mode, reflection of an outside image when external light is reflected on the reflective polarizing plate 14 can be suppressed, and display characteristics of an image can be improved. Also, by providing the quarter wave plate between the reflective polarizing plate 14 and the substrate 100, external light which passes through the reflective polarizing plate 14 can be prevented from returning to outside of the display device again. Furthermore, the reflection of an outside image can be suppressed, and display characteristics of an image can be improved. Moreover, light emitted in the light-emitting layer 12 can be extracted efficiently, and improvement in brightness of a display image can be attempted.

Embodiment Mode 4

Figure 4A:
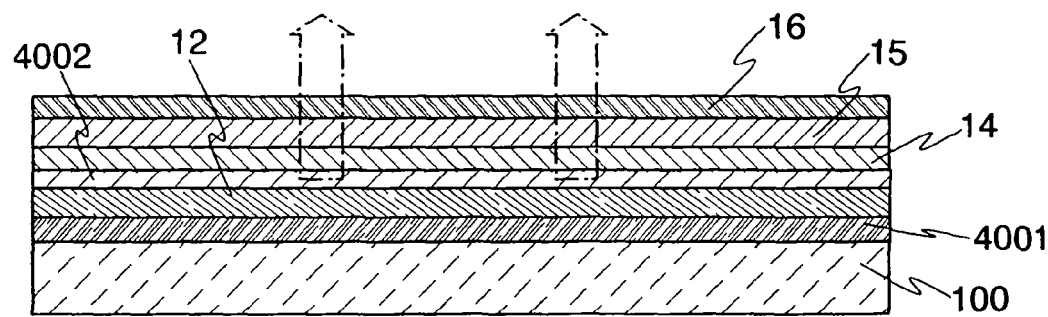
FIGS. 4A and 4B are schematic cross-sectional views each showing a display device.
Figure 4B:
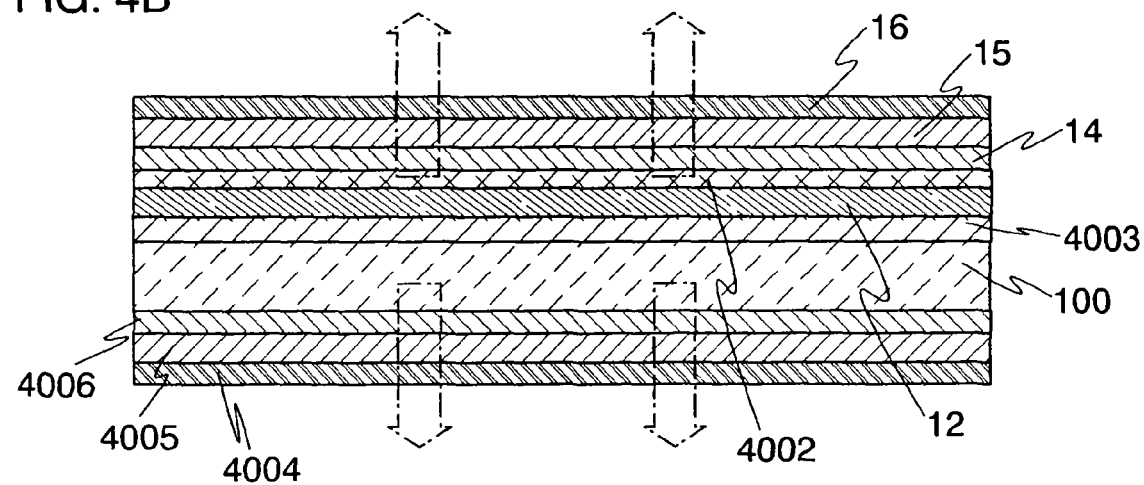

In this embodiment mode, a display device in which an extraction direction of light emission from a light-emitting layer is different from those in Embodiment Modes 1 to 3 will be explained. It is to be noted that, in FIGS. 4A and 4B, the same portions as those in FIGS. 1A and 1B are denoted by the same reference numerals, and the explanation is omitted. In FIGS. 4A and 4B, part of a display device of this embodiment mode is shown.

As shown in FIG. 4A, the display device of this embodiment mode has a structure in which a reflective electrode 4001, a light-emitting layer 12, a transparent electrode 4002, a reflective polarizing plate 14, a quarter wave plate 15, and a polarizing plate 16 are sequentially stacked over a substrate 100. In this embodiment mode, a structure is employed, in which light emission from the light-emitting layer 12 is extracted from the transparent electrode 4002 side (an opposite side of the substrate 100). It is to be noted that, in this embodiment mode, a single layer or a stacked layer of an insulating film may be provided between the transparent electrode 4002 and the reflective polarizing plate 14. In addition, a scattering layer such as a prism may also be provided between the transparent electrode 4002 and the reflective polarizing plate 14. Further alternatively, a quarter wave plate may be provided.

In the structure shown in FIG. 4A, since light emission from the light-emitting layer 12 is not extracted through the substrate 100, the substrate 100 is not necessarily a transparent substrate. For example, a ceramic substrate, a silicon substrate, a metal substrate, a stainless steel substrate, or the like may be used.

By the structure shown in FIG. 4A, external light which enters the display device from the polarizing plate 16 side is absorbed in the polarizing plate 16; accordingly, reflection of an outside image can be suppressed.

On the other hand, light emitted in the light-emitting layer 12 is repeatedly reflected between the reflective polarizing plate 14 and the reflective electrode 4001. Accordingly, a light emission component from the light-emitting layer 12, which has not conventionally been able to be used, can be utilized effectively, and enhancement of brightness of a display image can be attempted.

In the display device shown in FIG. 4A, reflection of an outside image when external light is reflected on the reflective polarizing plate 14 can be suppressed, and display characteristics of an image can be improved. Moreover, light emitted in the light-emitting layer 12 can be extracted efficiently, and decrease in brightness of a display image can be suppressed.

A transparent electrode 4003 may be provided instead of the reflective electrode 4001 of FIG. 4A (FIG. 4B). In that case, a reflective polarizing plate, a quarter wave plate, and a polarizing plate are preferably provided at each side of the substrate 100. In other words, as shown in FIG. 4B, the display device has a structure in which a first polarizing plate 4004, a first quarter wave plate 4005, a first reflective polarizing plate 4006, the substrate 100, a first transparent electrode 4003, the light-emitting layer 12, a second transparent electrode 4002, a second reflective polarizing plate 14, a second quarter wave plate 15, and a second polarizing plate 16 are sequentially stacked. In this embodiment mode, light emission from the light-emitting layer 12 is extracted from the transparent electrode 4002 side and the transparent electrode 4003 side. In other words, light is extracted from two directions which are the substrate 100 side and the opposite side of the substrate 100.

It is to be noted that, in this embodiment mode, a single layer or a stacked layer of an insulating film may be provided between the transparent electrode 4002 and the reflective polarizing plate 14. In addition, between the transparent electrode 4002 and the reflective polarizing plate 14, a scattering layer such as a prism may also be provided, or further, a quarter wave plate may be provided.

By the structure shown in FIG. 4B, external light which enters the display device from the first polarizing plate 4004 side or the second polarizing plate 16 side is absorbed in the first polarizing plate 4004 or the second polarizing plate 16, and is not emitted outside again. Thus, reflection of an outside image can be suppressed. Further, in a case of using a linear polarization reflective polarizing plate as the reflective polarizing plate, it is preferable that the first polarizing plate and the second polarizing plate be arranged so that their transmission axes cross at right angles. By making the transmission axes cross at right angles, light of light emitted from the light-emitting layer 12 to go toward one light emission side, which is reflected on the first reflective polarizing plate 4006 or the second reflective polarizing plate 14 and returns, can be efficiently extracted from an opposite light emission surface. In addition, in a case of using a circular polarization reflective polarizing plate as the reflective polarizing plate, it is preferable that the first reflective polarizing plate and the second reflective polarizing plate be arranged so that their spiral rotation directions are opposite to each other. By making the rotation directions opposite to each other, light emission from the light-emitting layer 12 can be extracted efficiently.

The polarizing plates 16 and 4004 each have functions of transmitting linear polarization having a vibrating surface which is parallel to the polarizing axis and absorbing linear polarization having the vibrating surface which crosses the polarizing axis at right angles.

In this embodiment mode, in a case of using the linear polarization reflective polarizing plate as the reflective polarizing plate, a polarizing axis of the reflective polarizing plate 14 and a slow axis of the quarter wave plate 15 are arranged so as to have an angle of 45° or 135° between them, and a polarizing axis of the reflective polarizing plate 4006 and a slow axis of the quarter wave plate 4005 are arranged so as to have an angle of 45° or 135° between them.

As the transparent electrodes 4002 and 4003 of FIGS. 4A and 4B, the following can be used: indium tin oxide (ITO), indium tin oxide containing silicon oxide (ITSO), zinc oxide (ZnO), indium zinc oxide (IZO) formed using a target in which 2 to 20 wt % of zinc oxide (ZnO) is further mixed with indium oxide containing silicon oxide, zinc oxide containing gallium (GZO), tin oxide ($SnO_2$), indium oxide ($In_2O_3$), or the like.

It is preferable to use highly reflective metal as the reflective electrode 4001 of FIG. 4A. Aluminum (Al), silver (Ag), an AlLi alloy or a MgAg alloy which are alloys containing the metal, and the like can be used. In addition, the reflective electrode 4001 may be formed of a stacked layer of the highly reflective metal and other electrode material. By forming a thin film (e.g., approximately 5 nm) of alkali metal or alkaline earth metal and stacking the thin film with the highly reflective metal, an electron injecting property can be enhanced.

In the display device of this embodiment mode, reflection of an outside image when external light is reflected on reflective polarizing plate can be suppressed, and display characteristics of an image can be improved. In addition, light emitted in the light-emitting layer 12 can be extracted efficiently, and improvement in brightness of a display image can be attempted.

Embodiment Mode 5

In this embodiment mode, a manufacturing process of a display device having a thin film transistor (TFT) will be explained. It is to be noted that, although a structure in which light emission from a light-emitting layer 12 is extracted only from a substrate 100 side is explained in this embodiment mode, the present invention is not limited thereto. A structure in which light emission is extracted from a side opposite to the substrate 100 may be employed. A structure in which light emission is extracted from two directions which are the substrate 100 side and the side opposite to the substrate 100 may also be employed.

Figure 5A:
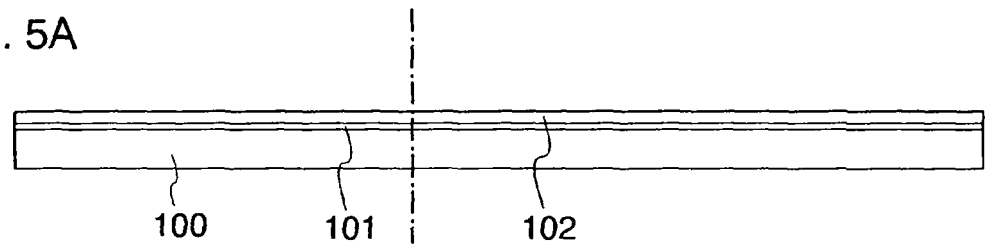
FIGS. 5A to 5E are views each showing an example of a manufacturing process of a display device.

First, as shown in FIG. 5A, the substrate 100 is prepared. As the substrate 100, a glass substrate of barium borosilicate glass, alumino borosilicate glass, or the like, a quartz substrate, a ceramic substrate, or the like can be used, for example. Although a substrate made of a flexible synthetic resin such as plastic generally tends to have lower allowable temperature limit than that of the above substrate, the substrate made of a flexible synthetic resin can be used as long as the substrate can endure a processing temperature in a manufacturing process. A surface of the substrate 100 may be planarized by polishing by a CMP method or the like.

Next, a base film 101 is formed over the substrate 100 (FIG. 5A). In a case of using glass for the substrate 100, the base film 101 can prevent alkali metal or alkaline earth metal contained in the substrate, such as Na from diffusing in a semiconductor film and having an adverse effect on characteristics of a semiconductor element. Therefore, the base film 101 is formed using an insulating film of silicon oxide, silicon nitride, silicon nitride oxide, or the like, which can suppress diffusion of alkali metal or alkaline earth metal in the semiconductor film. In this embodiment mode, a silicon nitride oxide film is formed to have a thickness of 10 to 400 nm by a plasma CVD method. It is to be noted that the silicon nitride oxide film can be formed by known methods such as a sputtering method and a decompression CVD method other than a plasma CVD method. In addition, although the base film 101 is formed of a single layer in this embodiment mode, the base film 101 may be formed of two or more layers.

In a case of using a substrate in which alkali metal or alkaline earth metal is somewhat contained, such as a glass substrate or a plastic substrate, it is effective to provide the base film 101 from the viewpoint of preventing impurity diffusion. However, when impurity diffusion is not such a big problem, such as a case of using a quartz substrate, the base film 101 is not necessarily provided.

Then, an amorphous semiconductor film 102 is formed over the base film 101. The amorphous semiconductor film 102 may be formed to have a thickness of 25 to 80 nm by using silicon or a material containing silicon as its main component (e.g., $Si_xGe_{1-x}$ or the like). As a manufacturing method, known methods such as a sputtering method, a decompression CVD method, and a plasma CVD method can be used.

Subsequently, the amorphous semiconductor film 102 is crystallized. The amorphous semiconductor film 102 is crystallized by a laser crystallization method, a thermal crystallization method using RTA or furnace anneal, a thermal crystallization method using a crystallization-promoting metal element (FIG. 5A).

Figure 5B:
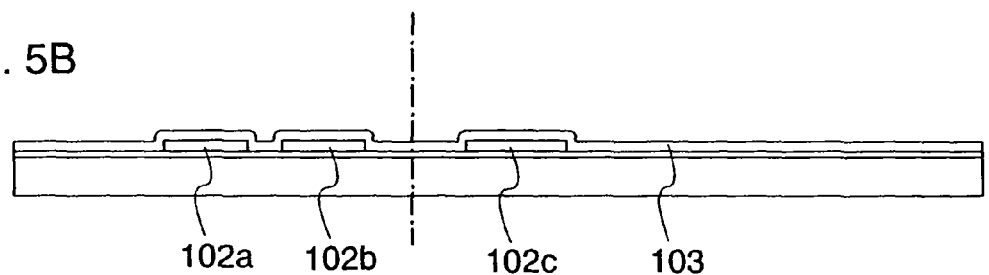

Next, island-shaped semiconductor films 102a to 102c are formed by etching the crystalline semiconductor film. Then, a gate insulating film 103 is formed so as to cover the island-shaped semiconductor films 102a to 102c (FIG. 5B). The gate insulating film 103 can be formed of a single layer or a stacked layer by using silicon oxide, silicon nitride, silicon nitride oxide, or the like, for example. The gate insulating film 103 can be formed by a plasma CVD method, a sputtering method, or the like. Here, the gate insulating film 102 is formed using an insulating film containing silicon to have a thickness of 30 to 200 nm by using a sputtering method.

Figure 5C:
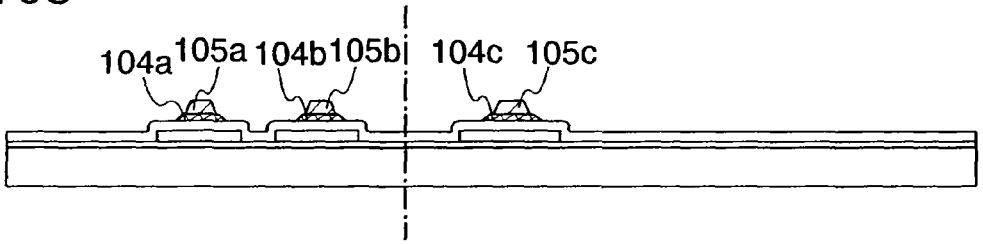

Then, a gate electrode is formed over the gate insulating film 103. In this embodiment mode, the gate electrode has a two-layer structure of a first conductive film and a second conductive film. A tantalum nitride (TaN) film is formed as each of first conductive layers 104a to 104c, and a tungsten (W) film is formed thereover as each of second conductive layers 105a to 105c (FIG. 5C). Both the tantalum nitride (TaN) film and the tungsten (W) film may be formed by a sputtering method. The tantalum nitride (TaN) film is formed using a target of tantalum in a nitrogen atmosphere and the tungsten (W) film may be formed using a target of tungsten.

It is to be noted that, although the first conductive layer is formed of TaN and the second conductive layer is formed of W in this embodiment mode, the present invention is not limited thereto. Both the first conductive layer and the second conductive layer may be formed of an element selected from Ta, W, Ti, Mo, Al, Cu, Cr, and Nd; an alloy material containing the above element as its main component; or a compound material thereof. In addition, a semiconductor film typified by a polycrystalline silicon film doped with an impurity element such as phosphorus may also be used. Moreover, an AgPdCu alloy may also be used. A combination thereof may be appropriately selected. The first conductive layer may be formed to have a thickness of 20 to 100 nm, and the second conductive layer may be formed to have a thickness of 100 to 400 nm. Although the gate electrode has a stacked structure of two layers in this embodiment, a one-layer structure or a stacked structure of three or more layers may also be used.

Next, impurities imparting n-type or p-type conductivity is selectively added to the semiconductor films 102a to 102c by using the gate electrode or a resist which is etched as a mask so that a source region, a drain region, an LDD region, and the like are formed.

Figure 5D:
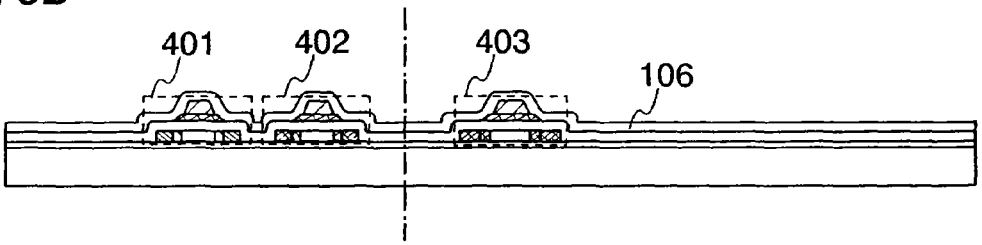

Next, a resist mask is removed, and a first passivation film 106 is formed (FIG. 5D). As the first passivation film 106, an insulating film containing silicon is formed to have a thickness of 100 to 200 nm. The first passivation film 106 may be formed by using a plasma CVD method and a sputtering method. In this embodiment mode, a silicon oxynitride film is formed by a plasma CVD method. In a case of using the silicon oxynitride film, a silicon oxynitride film formed of $SiH_4$, $N_2O$, and $NH_3$ or a silicon oxynitride film formed of $SiH_4$ and $N_2O$ may be formed by a plasma CVD method. Manufacturing conditions in this case are as follows: a reaction pressure is set to be 20 to 200 Pa, a substrate temperature is set to be 300 to 400° C., and a high-frequency (60 MHz) power density is set to be 0.1 to 1.0 W/cm$^2$. In addition, a silicon oxynitride hydride film formed of $SiH_4$, $N_2O$, and $H_2$ may also be applied as the first passivation film. It is needless to say that the first passivation film 106 is not limited to the single layer of the silicon oxynitride film as in this embodiment mode, and a single layer of other insulating film containing silicon or a stacked layer thereof may also be used.

Thereafter, a laser annealing method is preferably performed to restore crystallinity of the semiconductor film and activate an impurity element added to the semiconductor film 106. In addition, by performing heat treatment after forming the first passivation film 106, hydrogenation of the semiconductor film can be performed concurrently with activation treatment. The hydrogenation is performed to terminate a dangling bond of the semiconductor film by hydrogen contained in the first passivation film 106. Here, the hydrogenation is performed by using a SiNO film for the passivation film 106 at a temperature of 410° C. under an nitrogen atmosphere.

Alternatively, heat treatment may be performed before forming the first passivation film 106. However, in a case where materials for forming the first conductive layers 104a to 104c and the second conductive layers 105a to 105c are weak against heat, heat treatment is preferably performed after forming the first passivation film 106 in order to protect a wiring or the like as in this embodiment mode. Furthermore, in this case, since the first passivation film is not formed yet, hydrogenation obviously cannot be performed using hydrogen contained in the passivation film.

In this case, hydrogenation may be performed by means using hydrogen which is excited by plasma (plasma hydrogenation), or hydrogenation may be performed by heat treatment in an atmosphere containing hydrogen of 3 to 100% at a temperature of 300 to 450° C. for 1 to 12 hours. In this manner, TFTs 401 to 403 having the semiconductor film, the gate insulating film, and the gate electrode can be obtained. It is to be noted that the structure of the TFTs 401 to 403 is not limited to the one in this embodiment mode.

Figure 5E:
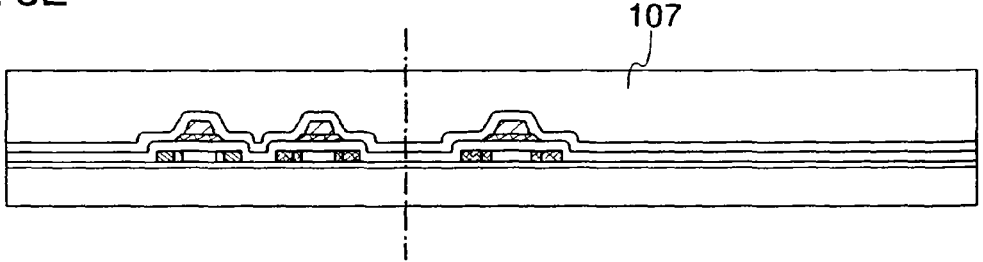

Next, a first interlayer insulating film 107 is formed over the first passivation film 106 (FIG. 5E). An inorganic insulating film or an organic insulating film can be used as the first interlayer insulating film 107. As the inorganic insulating film, a silicon oxide film formed by a CVD method or a silicon oxide film coated by an SOG (spin on glass) method can be used. As the organic insulating film, a film formed of polyimide, polyamide, BCB (benzocyclobutene), acrylic, a positive photosensitive organic resin, a negative photosensitive organic resin, or the like can be used. In addition, a stacked structure of an acrylic film and a silicon oxynitride film may also be used.

Siloxane in which a skeleton structure is formed by a bond of silicon (Si) and oxygen (O) can be used as a material for the interlayer insulating film. As a substituent of siloxane, an organic group containing at least hydrogen (e.g., an alkyl group, aromatic hydrocarbon, or the like) is used. Furthermore, as a substituent, a fluoro group may also be used. Alternatively, as a substituent, both of an organic group containing at least hydrogen and a fluoro group may be used.

Siloxane based polymer, according to its structure, can be classified into silica glass, alkylsiloxane polymer, alkylsilsesquioxane polymer, hydrogen silsesquioxane polymer, hydrogen alkylsilsesquioxane polymer, or the like, for example. In addition, the interlayer insulating film may be formed using a material containing polymer having a Si—N bond (polysilazane).

By using the above materials, an interlayer insulating film having enough insulating property and planarizing property can be obtained even when the film is formed to be thin. In addition, the above materials have high heat resistance; therefore, an interlayer insulating film which can endure reflow treatment that is performed for a multilayer wiring can be obtained. Furthermore, the above materials have a low hygroscopic property; therefore, an interlayer insulating film with a small amount of dehydration can be formed.

In this embodiment mode, siloxane-based polymer is used for forming the first interlayer insulating film 107. Concavity and convexity due to TFTs formed over the substrate can be reduced by the first interlayer insulating film 107, and planarization can be performed. In particular, since the first interlayer insulating film 107 is used mainly for the purpose of planarization, an insulating film using an easily-planarized material is preferably used. In addition, silicon oxide containing nitrogen can be used for the first interlayer insulating film, in which case the first passivation film is not necessary to be provided.

Thereafter, a second passivation film formed of a silicon nitride oxide film or the like may be formed over the first interlayer insulating film 107. The second passivation film may be formed to have a thickness of approximately 10 to 200 nm. The second passivation film can prevent moisture from entering and leaving the first interlayer insulating film 107. Besides the silicon nitride oxide film, a silicon nitride film, an aluminum nitride film, an aluminum oxynitride film, a diamond like carbon (DLC) film, and a carbon nitride (CN) film can be used for the second passivation film in the same manner.

A film formed using an RF sputtering method has high density and an excellent barrier property. In a case of forming a silicon oxynitride film for example, the silicon oxynitride film is formed by RF sputtering under conditions where Si is used as a target, $N_2$, Ar, and $N_2O$ are flowed with the gas-flow ratio of 31:5:4, respectively, the pressure is set to be 0.4 Pa, and the power is set to be 3,000 W. In addition, in a case of forming a silicon nitride film for example, the silicon nitride film is formed by RF sputtering under conditions where Si is used as a target, $N_2$ and Ar in a chamber are flowed with the gas-flow ratio of 1:1, the pressure is set to be 0.8 Pa, the power is set to be 3,000 W, and a film-forming temperature is set to be 215° C.

Figure 6A:
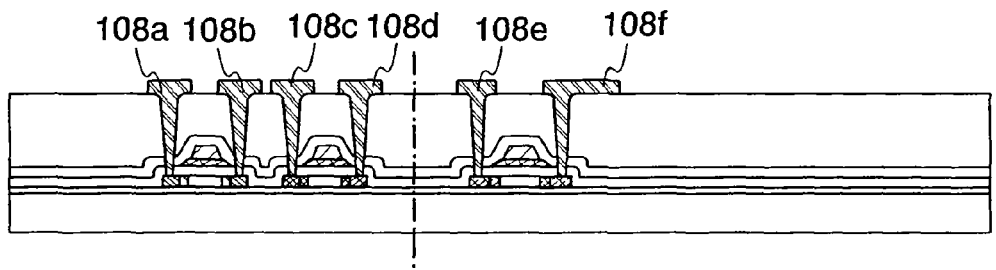
FIGS. 6A to 6D are views each showing an example of a manufacturing process of a display device.

Then, the first interlayer insulating film 107 and the first passivation film 106 are etched to form contact holes reaching a source region and a drain region. Subsequently, wirings 108a to 108f each of which is electrically connected to the source region or the drain region in each TFT are formed (FIG. 6A). As the wirings 108a to 108f, a single layer structure or a stacked layer structure formed of one element selected from Al, Ni, W, Mo, Ti, Pt, Cu, Ta, Au, and Mn, or an alloy containing a plurality of the elements can be used. Here, the wirings 108a to 108f are preferably formed of a metal film containing Al. In this embodiment mode, a stacked film formed of a Ti film and an alloy film containing Al and Ti is formed by etching. It is needless to say that the structure is not limited to a two-layer structure, and a single layer structure and a stacked structure of three or more layers may be used. In addition, the materials for the wirings are not limited to a stacked film including Al and Ti. For example, the wirings may be formed by forming an Al film or a Cu film over a TaN film and etching a stacked film in which a Ti film is further formed.

Next, a second interlayer insulating film 109 is formed so as to cover the wirings 108a to 108f. A similar material to that described above for the first interlayer insulating film can be used for the second interlayer insulating film. In this embodiment mode, siloxane-based polymer is used for the second interlayer insulating film 109. Since siloxane-based polymer has high heat resistance, an interlayer insulating film which can endure reflow treatment that is performed for a multilayer wiring can be obtained.

Figure 6B:
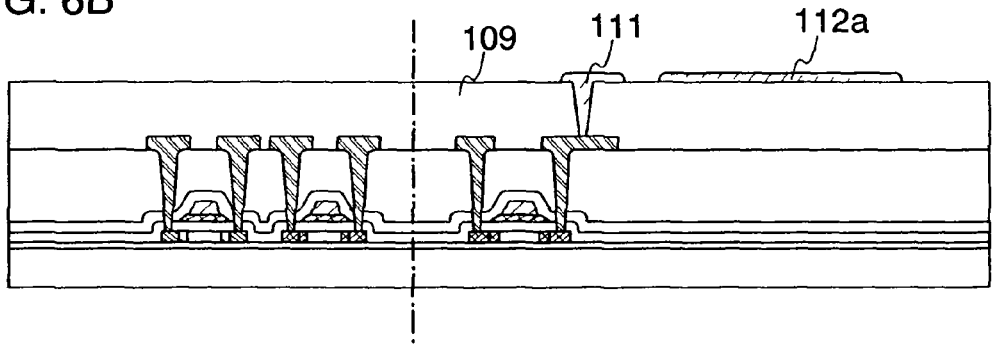

Subsequently, the second interlayer insulating film 109 is selectively etched to form a contact hole. After that, a wiring 111 for being connected to the wiring 108f is formed. In addition, a pixel electrode 112a is formed at the same time as the wiring 111 (FIG. 6B). The wiring 111 and the pixel electrode 112a can be formed using a single layer or a stacked structure formed of one element selected from Al, Ni, W, Mo, Ti, Pt, Cu, Ta, Au, and Mn, or an alloy containing a plurality of the elements. In this embodiment mode, an Al alloy may be used, and the wiring 111 and the pixel electrode 112a are formed by Al—Ni—C.

Figure 6C:
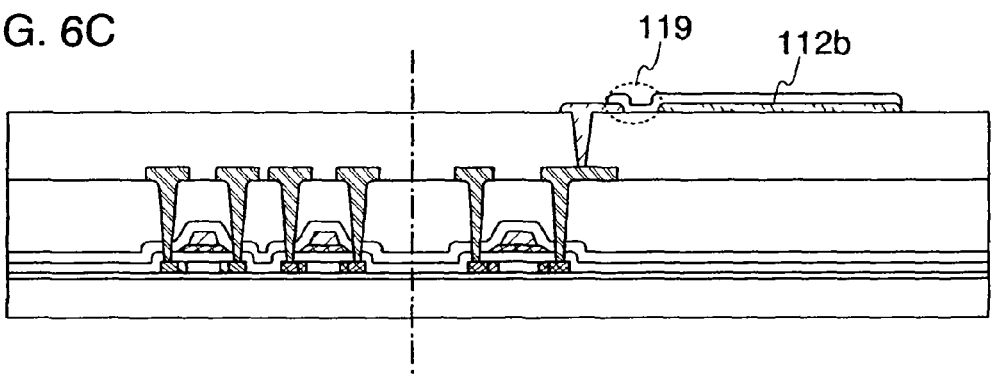

Next, a pixel electrode 112b is formed over the second interlayer insulating film 109, the wiring 111, and the pixel electrode 112a (FIG. 6C). The pixel electrode 112b is formed so as to be in contact with the second interlayer insulating film 109 at least in a region 119 where the pixel electrode 112*b* is not overlapped with the wiring 111 and the pixel electrode 112*a*. In this embodiment mode, the pixel electrode 112*a* and the pixel electrode 112*b* are formed of a transparent conductive film. For example, indium tin oxide (ITO), zinc oxide (ZnO), indium zinc oxide (IZO), zinc oxide added with gallium (GZO), and other light-transmitting oxide conductive material can be used. Indium tin oxide (ITO) and indium tin oxide containing silicon oxide (ITSO), or indium zinc oxide formed using a target in which 2 to 20 wt % of zinc oxide (ZnO) is mixed with indium oxide containing silicon oxide may be used.

Figure 7:
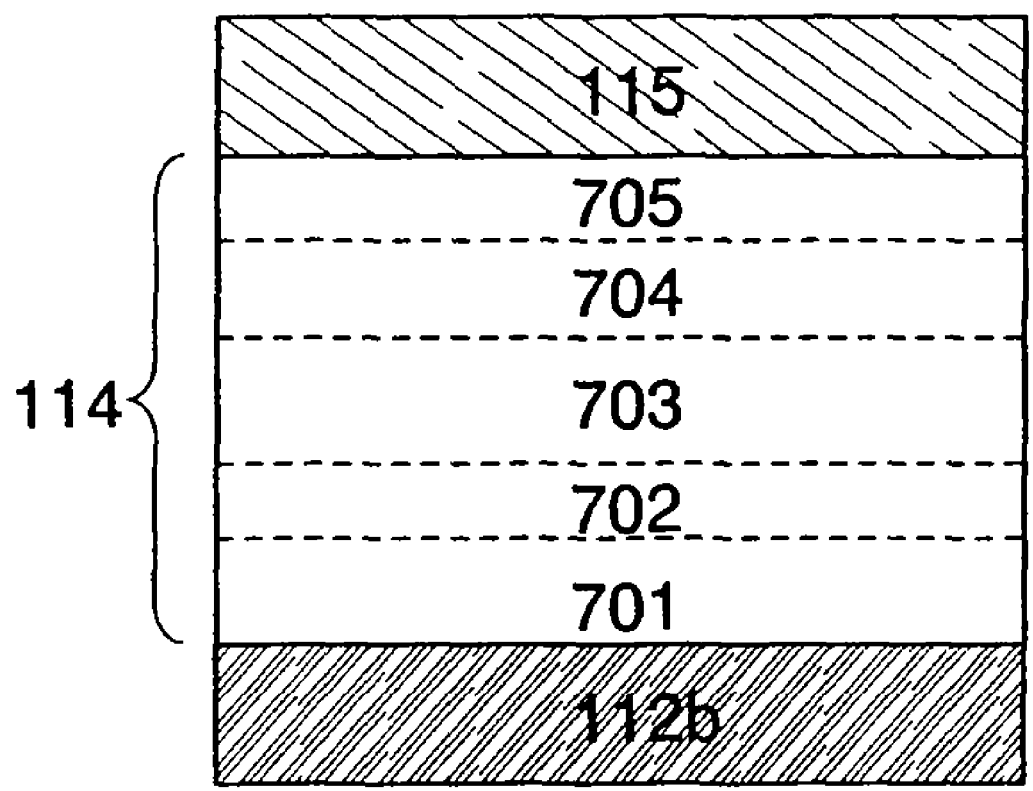
FIG. 7 is a view showing an example of a manufacturing process of a display device.

Then, an insulating film (a partition wall or a bank) 116 is formed so as to cover ends of the pixel electrodes 112*a* and 112*b*, and a light-emitting layer 114 is formed so as to be in contact with the pixel electrode 112*b*. The light-emitting layer 114 contains a light-emitting substance. For example, the light-emitting layer 114 has a hole injecting layer 701, a hole transporting layer 702, a light-emitting layer 703, an electron transporting layer 704, and an electron injecting layer 705 (FIG. 7). It is to be noted that the structure of the light-emitting layer 114 is not necessarily limited thereto. The light-emitting layer 114 includes a single layer or stacked structure having at least a light-emitting layer. FIG. 7 shows a schematic cross-sectional view of the light-emitting layer 114 having the hole injecting layer 701, the hole transporting layer 702, the light-emitting layer 703, the electron transporting layer 704, and the electron injecting layer 705, which are interposed between the pixel electrode 112*b* and an electrode 115.

Materials having a hole transporting property, relatively small ionization potential, and a high hole injecting property are desirably used for the hole injecting layer 701. The materials are classified broadly into metal oxide, a low molecular organic compound, and a high molecular organic compound. As the metal oxide, vanadium oxide, molybdenum oxide, ruthenium oxide, aluminum oxide, or the like can be used, for example. As the low molecular compound, starburst amine typified by m-MTDATA; metallophthalocyanine typified by copper phthalocyanine (abbreviation: Cu—Pc); phthalocyanine (abbreviation: $H_2$—Pc); a 2,3-dioxyethylene thiophene derivative; or the like can be used. A film formed by co-evaporation of the low molecular weight organic compound and the above metal oxide may also be used. As the high molecular weight organic compound, for example, high molecule such as polyaniline (abbreviation: PAni), polyvinyl carbazole (abbreviation: PVK), or a polythiophene derivative can be used. Polyethylene dioxythiophene (abbreviation: PEDOT), which is one of polythiophene derivatives, doped with polystyrene sulfonate (abbreviation: PSS). In addition, a mixture of a benzoxazole derivative and any one or more of TCQn, $FeCl_3$, $C_{60}$ and $F_4TCNQ$ may be used.

Known materials having a high hole transporting property and low crystallinity are desirably used for the hole transporting layer 702. For example, aromatic amine-based compounds (that is, compounds having a bond of benzene ring-nitrogen) are preferable, and there are 4,4'-bis[N-(3-methylphenyl)-N-phenylamino]biphenyl (abbreviation: TPD); a derivative thereof such as 4,4'-bis[N-(1-naphthyl)-N-phenylamino]biphenyl (abbreviation: α-NPD); and the like. Besides, starburst aromatic amine compounds such as 4,4',4''-tris(N,N-diphenylamino)triphenylamine (abbreviation: TDATA) and MTDATA can be used. In addition, 4,4'4"-tris(N-carbazolyl)triphenylamine (abbreviation: TCTA) may also be used. Moreover, as a high molecular material, poly (vinylcarbazole) or the like showing a favorable hole transporting property can be used.

Materials having high ionization potential and a large bandgap are desirably used for the light-emitting layer 703. For example, metal complexes such as tris(8-quinolinolato) aluminum (abbreviation: $Alq_3$), tris(4-methyl-8-quinolinolato)aluminum (abbreviation: $Almq_3$), bis(10-hydroxybenzo [h]-quinolinato)beryllium (abbreviation: $BeBq_2$), bis(2-methyl-8-quinolinolato)-(4-hydroxy-biphenyl)aluminum (abbreviation: BAlq), bis[2-(2-hydroxyphenyl)-benzoxazolato]zinc (abbreviation: $Zn(BOX)_2$), and bis[2-(2-hydroxyphenyl)-benzothiazolato]zinc (abbreviation: $Zn(BTZ)_2$)can be used. In addition, various fluorescent pigments (such as a coumarin derivative, a quinacridone derivative, rubrene, 4,4-dicyanomethylene, a 1-pyrone derivative, a stilbene derivative, and various condensed aromatic compounds) can also be used. Moreover, phosphorescent materials such as a platinum octaethylporphyrin complex, a tris(phenylpyridine)iridium complex, and a tris(benzylideneacetonate)phenanthrene europium complex can be used.

As host materials used for the light-emitting layer 703, hole transporting materials or electron transporting materials typified by the above-described examples can be used. Besides, bipolar materials such as 4,4'-N,N'-dicarbazolyl biphenyl (abbreviation: CBP) can also be used.

Materials having a high electron transporting property are desirably used for the electron transporting layer 704. For example, a metal complex having a quinoline skeleton or a benzoquinoline skeleton typified by $Alq_3$, a mixed ligand complex thereof, and the like can be used. Specifically, metal complexes such as $Alq_3$, $Almq_3$, $BeBq_2$, BAlq, $Zn(BOX)_2$, and $Zn(BTZ)_2$ are given. Besides the metal complexes, oxadiazole derivatives such as 2-(4-biphenylyl)-5-(4-tert-butylphenyl)-1,3,4-oxadiazole (abbreviation: PBD) and 1,3-bis [5-(p-tert-buthylphenyl)-1,3,4-oxadiazol-2-yl]benzene (abbreviation: OXD-7); triazole derivatives such as 3-(4-tert-buthylphenyl)-4-phenyl-5-(4-biphenylyl)-1,2,4-triazole (abbreviation: TAZ) and 3-(4-tert-buthylphenyl)-4-(4-ethylphenyl)-5-(4-biphenylyl)-1,2,4-triazole (abbreviation: p-EtTAZ); imidazole derivatives such as TPBI; and phenanthroline derivatives such as bathophenanthroline (abbreviation: BPhen) and bathocuproin (abbreviation: BCP) can be used.

Materials having a high electron injecting property are desirably used for the electron injecting layer 705. For example, an ultrathin film of an insulator such as alkali metal halide such as LiF or CsF; alkaline earth halide such as CaF2; alkali metal oxide such as $Li_2O$ is commonly used. In addition, alkali metal complexes such as lithiumacetylacetonate (abbreviation: Li(acac)) and 8-quinolinolato-lithium (abbreviation: Liq) are also effective. Moreover, one or a plurality of metal oxide such as molybdenum oxide (MoOx), vanadium oxide (VOx), ruthenium oxide (RuOx), or tungsten oxide (WOx); a benzoxazole derivative; alkali metal; alkaline earth metal; and transition metal may be used. Titanium oxide may also be used.

It is to be noted that the light-emitting layer 114 does not necessarily have all of these layers. In this embodiment mode, it is acceptable as long as the light-emitting layer 114 has at least the light-emitting layer 703. Light emission is not always extracted only from the light-emitting layer 703, and there is a case where light-emission can be obtained from layers other than the light-emitting layer 703, depending on a combination of materials used for other layers. In addition, a hole blocking layer may be provided between the light-emitting layer 703 and the electron transporting layer 704.

It is to be noted that there is a case where, depending on the color, lower voltage driving and higher reliability can be achieved by using a phosphorescent material than using a fluorescent material. In a case of performing full color display using light emitting elements corresponding to the three primary colors, the light emitting elements of the respective colors may be made to have the same deterioration level by combining a light emitting element using a fluorescent material and a light emitting element using a phosphorescent material.

In the light-emitting layer 114, a material that is resistant to etching is used for a layer which is closest to the electrode 115 (in this embodiment mode, the electron injecting layer 705). Thus, when the electrode 115 is formed over the light-emitting layer 114 by sputtering, sputtering damages to the layer which is closest to the electrode 115 (in this embodiment mode, the electron injecting layer 705) can be reduced. For example, a metal oxide such as molybdenum oxide (MoOx), vanadium oxide (VOx), ruthenium oxide (RuOx), or tungsten oxide (WOx); or a benzoxazole derivative can be used as the material that is resistant to etching. The material is preferably formed by an evaporation method. According to the above structure, even when the electrode 115 is formed by a sputtering method, sputtering damages to a layer containing an organic matter included in the light-emitting layer 114 can be suppressed, and the scope of material choices for forming the electrode 115 is expanded.

Figure 6D:
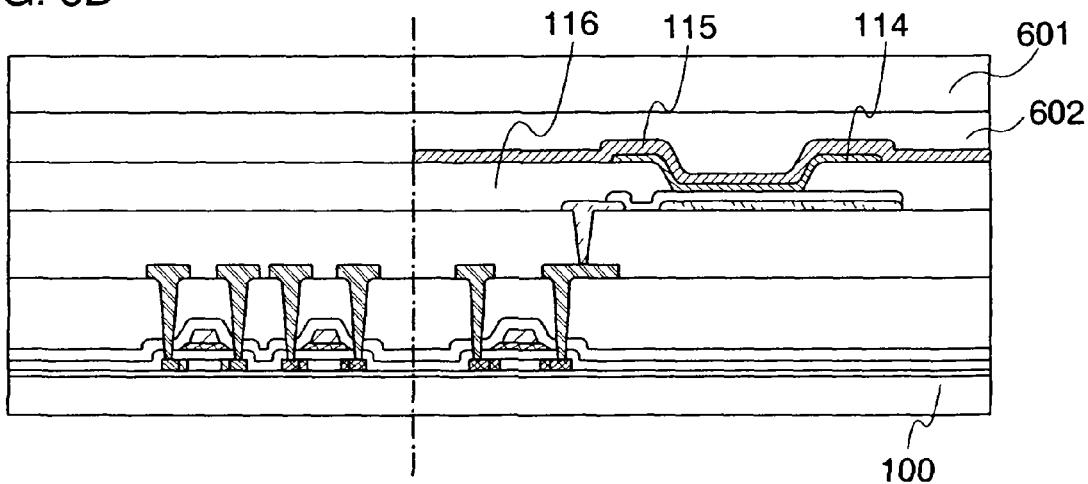

Thereafter, the electrode 115 is formed so as to be in contact with the light-emitting layer 114 (FIG. 6D). In this embodiment mode, the electrode 115 is formed of a reflective conductive film. Since the electrode 115 is used as a cathode, metal, an alloy, and an electro-conductive compound having low work function, and a mixture of these are used. For example, rare earth metal such as Yb or Er can be used in addition to alkali metal such as Li or Cs; alkaline earth metal such as Mg, Ca, or Sr; an alloy containing these (Mg:Ag, Al:Li, Mg:In, or the like); and a compound of these (CaF$_2$ or CaN). Moreover, in a case of providing the electron injecting layer, other conductive film of Al or the like can also be used.

After that, a protective layer may be formed over the electrode 115 by an evaporation method or a sputtering method using a mask. The protective layer protects the electrode 115. It is to be noted that the protective layer is not necessarily provided.

Then, a sealing substrate 601 is bonded by a sealant to seal the light-emitting element. A circumference of a display region is surrounded by the sealant so that the display device is sealed with the substrate 100 and the sealing substrate 601. Further, the region surrounded by the sealant is filled with a filler 602. Alternatively, the region surrounded by the sealant is filled with dried inert gas (FIG. 6D).

Figure 8:
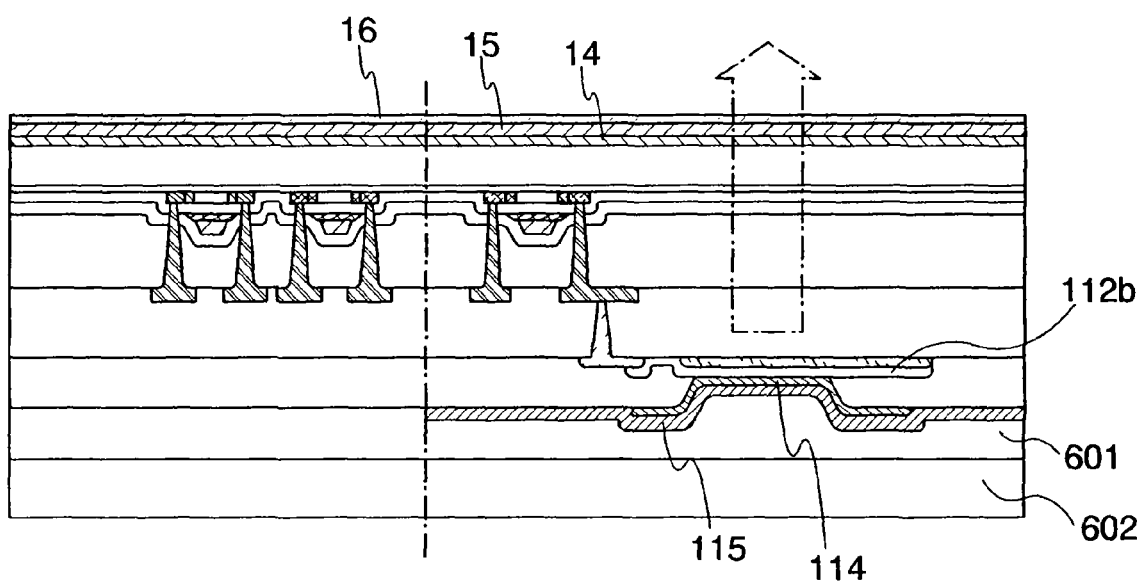
FIG. 8 is a view showing a structure of a light-emitting layer included in a display device.

Next, a reflective polarizing plate 14, a quarter wave plate 15, and a polarizing plate 16 are sequentially stacked over a surface of the substrate 100, which is opposite to the surface over which the electrode 15 is formed (FIG. 8). In this embodiment mode, in a case of using a linear polarization reflective polarizing plate as the reflective polarizing plate, a transmission axis of the reflective polarizing plate 14 and a delay axis of the quarter wave plate 15 are arranged so as to have an angle of 45° or 135° between them.

In the display device having the above structure, by applying voltage between the pixel electrode 112b and the electrode 115 and supplying forward bias current to the light-emitting layer 114, light is emitted from the light-emitting layer 114 and the light can be extracted from the pixel electrode 112b side.

According to the above steps, the display device shown in FIG. 8 can be manufactured. In the display device of this embodiment mode, reflection of an outside image when external light is reflected on the reflective polarizing plate 14 can be suppressed and display characteristics of an image can be improved. In addition, light emitted in the light-emitting layer 114 can be extracted efficiently, and improvement in brightness of a display image can be attempted.

Embodiment Mode 6

In this embodiment mode, a panel of the display device shown in Embodiment Mode 5 will be explained with reference to FIGS. 9A and 9B.

Figure 9A:
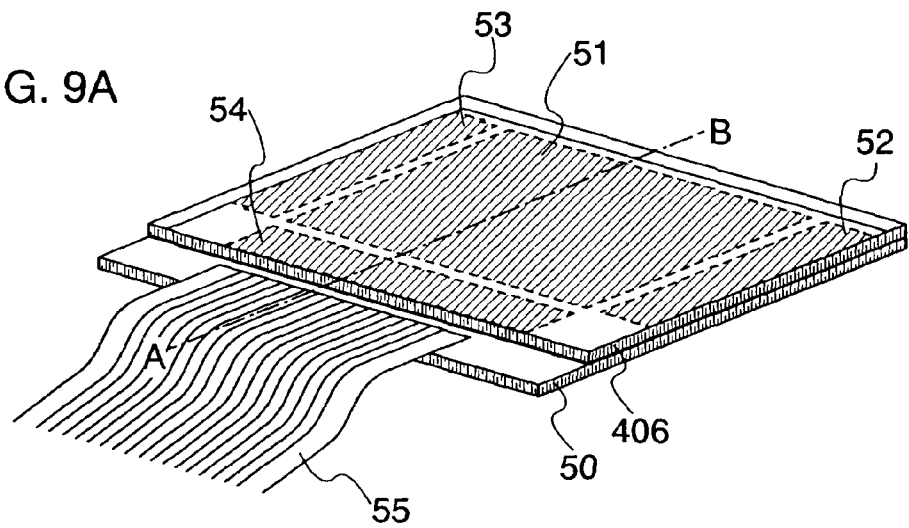
FIGS. 9A and 9B are views each showing a panel of a display device.

A display region 51 having a plurality of pixels each including a light-emitting element, gate drivers 52 and 53, a source driver 54, and a connection film 55 are provided over the substrate 50 (FIG. 9A). The connection film 55 is connected to an IC chip or the like.

Figure 9B:
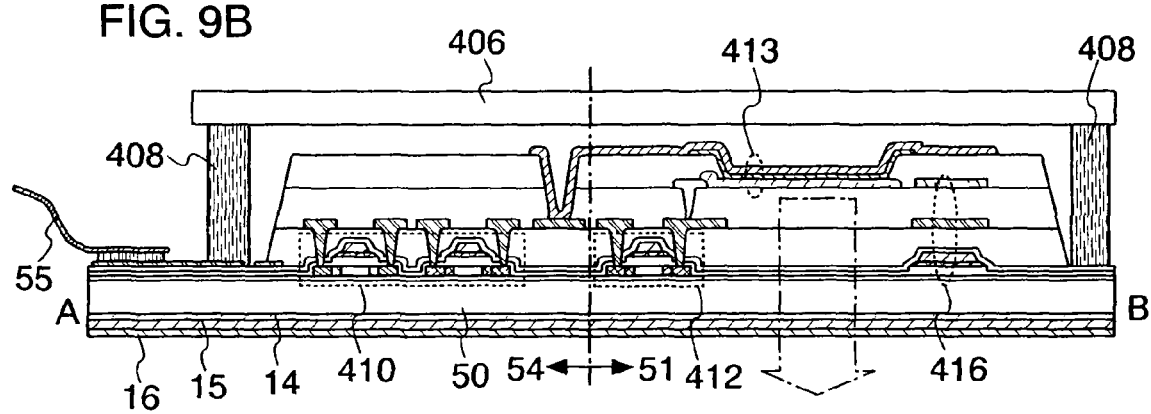

FIG. 9B is a cross-sectional view of a portion shown by a dashed line AB of the panel, which shows a transistor 412, a light-emitting element 413, and a capacitor element 416, each of which is provided in the display region 51, and a pixel group 410 provided in the source driver 54.

A sealant 408 is provided in the periphery of the display region 51, the gate drivers 52 and 53, and the source driver 54. The light-emitting element 413 is sealed by the sealant 408 and an opposite substrate 406. This sealing process is performed to protect the light-emitting element 413 from moisture. Although a sealing method using a cover material (such as glass, ceramics, plastic, or metal) is used here, a sealing method using a heat curable resin or an ultraviolet curable resin and a sealing method using a thin film of metal oxide, metal nitride, or the like having high barrier capability may also be used. It is preferable that an element formed over the substrate 50 be formed using a crystalline semiconductor (poly-silicon) having more preferable characteristics such as mobility than an amorphous semiconductor. Accordingly, monolithic integration over the same surface can be achieved. As for the panel having the above structure, the number of external ICs to be connected is decreased; therefore, downsizing, weight saving, and thinner shape can be realized. It is to be noted that, in this embodiment mode, a reflective polarizing plate 14, a quarter wave plate 15, and a polarizing plate 16 are sequentially stacked over a surface of the substrate 50, which is opposite to the surface over which the light-emitting element 413 is formed.

It is to be noted that the display region 51 is formed by a transistor having an amorphous semiconductor (amorphous silicon) formed over an insulating surface as a channel portion, and a circuit for controlling the display region 51 may be formed by an IC chip. An amorphous semiconductor can be easily formed over a large-sized substrate by using a CVD method, and does not need a crystallization process; thus, an inexpensive panel can be provided. In addition, if a conductive layer is formed by a droplet discharging method typified by an ink jetting method at this time, a more inexpensive panel can be provided. Moreover, the IC chip may be attached to the substrate 50 or the connection film 55 which is connected to the substrate 50 by a COG (chip on glass) method.

Figure 10A:
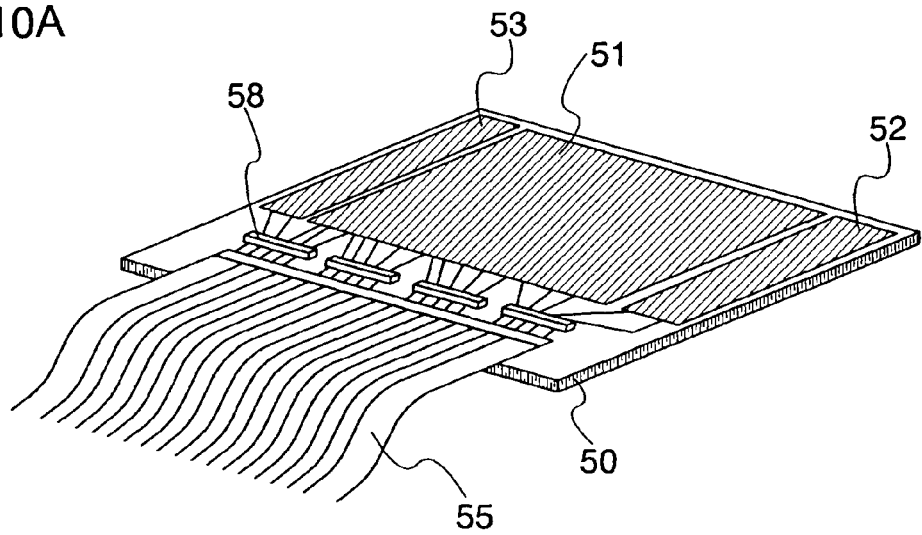
FIGS. 10A and 10B are views each showing a panel of a display device.
Figure 10B:
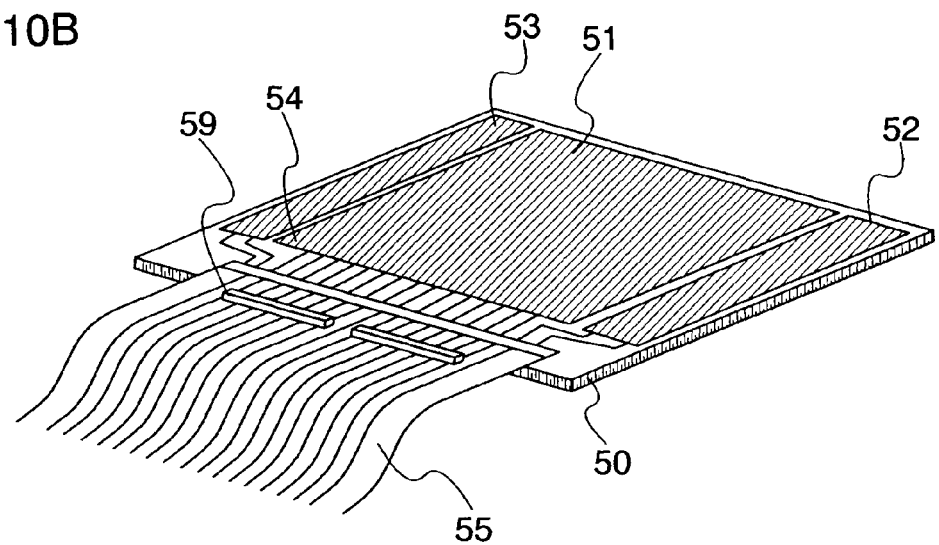

FIGS. 10A and 10B show a state in which an IC chip is mounted on an element substrate over which a display region having a plurality of pixels is formed. In FIG. 10A, a display region 51 and gate drivers 52 and 53 are formed over a substrate 50. A source driver formed in an IC chip 58 is mounted on the substrate 50. Specifically, the source driver formed in the IC chip 58 is attached to the substrate 50, and is electrically connected to the display region 51. In addition, power supply potential, various signals, and the like are supplied to each of the display region 51, the gate drivers 52 and 53, and the source driver formed in the IC chip 58 through a connection film 55.

In FIG. 10B, the display region 51 and the gate drivers 52 and 53 are formed over the substrate 50. A source driver formed in an IC chip 59 is further mounted on the connection film 55 which is mounted on the substrate 50. Power supply potential, various signals, and the like are supplied to each of the display region 51, the gate drivers 52 and 53, and the source driver formed in the IC chip 59 through the connection film 55.

A mounting method of the IC chip is not particularly limited, and a known COG method, wire bonding method, TAB method, or the like can be used. Also, a position where the IC chip is mounted is not limited to the position shown in FIGS. 10A and 10B as long as electrical connection is possible. Although an example in which only the source driver is formed in the IC chip is shown in FIGS. 10A and 10B, the gate driver may be formed in the IC chip. Alternatively, a controller, a CPU, a memory, and the like may be formed in the IC chip to be mounted. In addition, the whole source driver or gate driver may not be formed in the IC chip but only part of a circuit constituting each driver circuit may be formed in the IC chip.

It is to be noted that, by separately forming an integrated circuit such as a driver circuit by an IC chip and mounting, yield can be improved and optimization of a process according to characteristics of each circuit can be easily performed, as compared with a case of forming all circuits over a same substrate as a pixel portion.

Although not shown in FIGS. 10A and 10B, a protective circuit may be provided over a substrate over which the display region is formed. A discharge path can be ensured by the protective circuit; therefore, noises made by a signal and power supply voltage, or deterioration or dielectric breakdown of a semiconductor element formed over the substrate due to a charge which is charged in an insulating film for some reason can be prevented. Specifically, in a case of FIG. 10A, a protective circuit can be connected to the wiring which electrically connects the connection film 55 to the display region 51. Moreover, the protective circuit can be connected to each of the wiring which electrically connects the connection film 55 to the IC chip 58 in which the source driver is formed, the wiring which electrically connects the connection film 55 to the gate drivers 52 and 53, the wiring (a source line) which electrically connects the IC chip 58 in which the source driver is formed to the display region 51, and the wiring (a gate line) which electrically connects the gate drivers 52 and 53 to the display region 51.

In the display device of this embodiment mode, reflection of an outside image when external light is reflected on the reflective polarizing plate 14 can be suppressed, and display characteristics of an image can be improved. In addition, light emitted in the light-emitting layer 413 can be extracted efficiently, and improvement in brightness of a display image can be attempted.

Embodiment Mode 7

In this embodiment mode, examples of electronic apparatuses including the display device shown in Embodiment Modes 1 to 6 will be explained with reference to FIGS. 11A to 11E.

Figure 11A:
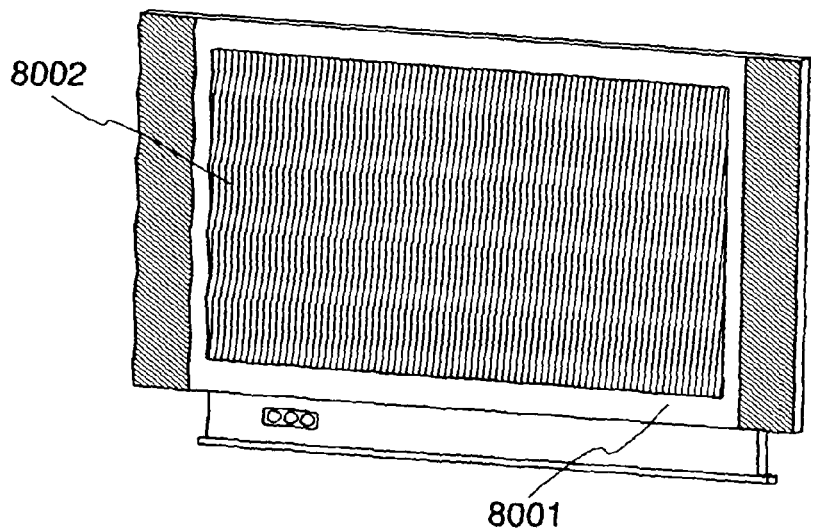
FIGS. 11A to 11E are views each showing an electronic apparatus using a display device.

A television shown in FIG. 11A includes a main body 8001, a display portion 8002, and the like. The display portion 8002 has a display device including a reflective polarizing plate, a quarter wave plate, and a polarizing plate. By providing the display portion 8002 having the display device, a television in which reflection of an outside image is suppressed and display characteristics of an image are improved can be provided. In addition, a television in which light emitted in a light-emitting layer can be extracted efficiently and brightness of a display image is improved can be provided.

Figure 11B:
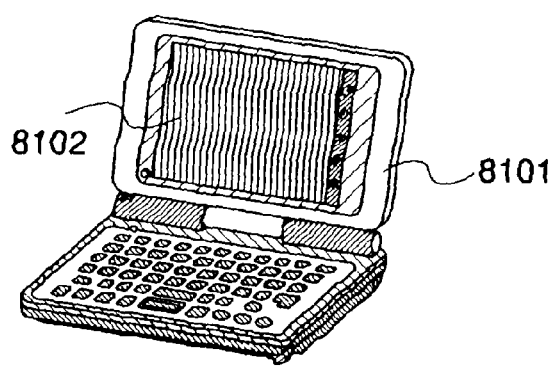

An information terminal device shown in FIG. 11B includes a main body 8101, a display portion 8102, and the like. The display portion 8102 has a display device including a reflective polarizing plate, a quarter wave plate, and a polarizing plate. By providing the display portion 8102 having the display device, an information terminal device in which reflection of an outside image is suppressed and display characteristics of an image are improved can be provided. In addition, an information terminal device in which light emitted in a light-emitting layer can be extracted efficiently and brightness of a display image is improved can be provided.

Figure 11C:
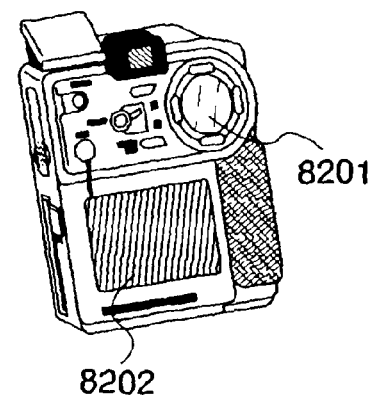

A video camera shown in FIG. 11C includes a main body 8201, a display portion 8202, and the like. The display portion 8202 has a display device including a reflective polarizing plate, a quarter wave plate, and a polarizing plate. By providing the display portion 8202 having the display device, a video camera in which reflection of an outside image is suppressed and display characteristics of an image are improved can be provided. In addition, a video camera in which light emitted in a light-emitting layer can be extracted efficiently and brightness of an display image is improved can be provided.

Figure 11D:
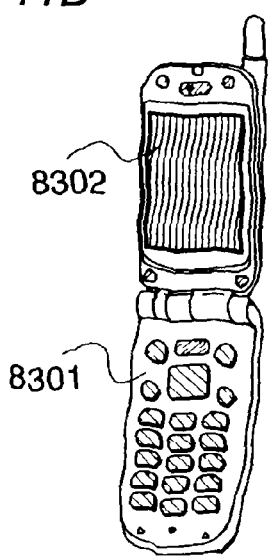

A telephone set shown in FIG. 11D includes a main body 8301, a display portion 8302, and the like. The display portion 8302 has a display device including a reflective polarizing plate, a quarter wave plate, and a polarizing plate. By providing the display portion 8302 having the display device, a telephone set in which reflection of an outside image is suppressed and display characteristics of an image are improved can be provided. In addition, a telephone set in which light emitted in a light-emitting layer can be extracted efficiently and brightness of a display image is improved can be provided.

Figure 11E:
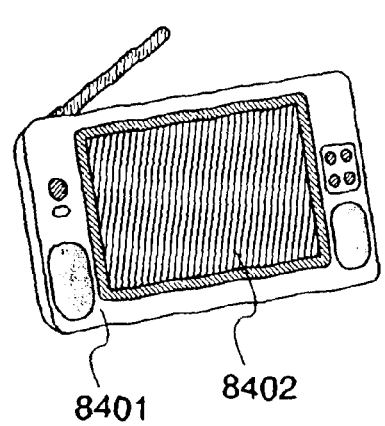

A portable television shown in FIG. 11E includes a main body 8401, a display portion 8402, and the like. The display portion 8402 has a display device including a reflective polarizing plate, a quarter wave plate, and a polarizing plate. By providing the display portion 8402 having the display device, a portable television in which reflection of an outside image is suppressed and display characteristics of an image are improved can be provided. In addition, a portable television in which light emitted in a light-emitting layer can be extracted efficiently and brightness of a display image is improved can be provided. Moreover, the display device of the present invention can be applied to various televisions such as a small-sized one incorporated in a portable terminal such as a portable phone, a medium-sized one which is portable, and a large-sized one (e.g., 40 inches or more in size).

It is to be noted that electronic apparatuses according to the present invention are not limited to those shown in FIGS. 11A to 11E. An electronic apparatus which has a display device including a reflective polarizing plate, a quarter wave plate, and a polarizing plate for a display portion is included.

As described above, by providing a display portion or the like having a display device including a reflective polarizing plate, a quarter wave plate, and a polarizing plate, an electronic apparatus in which reflection of an outside image is suppressed and display characteristics of an image are improved can be provided. In addition, an electronic apparatus in which light emitted in a light-emitting layer can be extracted efficiently and brightness of a display image is improved can be provided.

This application is based on Japanese Patent Application serial No. 2005-303770 filed in Japan Patent Office on Oct. 18, 2005, the entire contents of which are hereby incorporated by reference.

What is claimed is:

1. An electronic apparatus comprising:
a light-emitting layer provided over a first electrode;
a second electrode provided over the light-emitting layer,
a substrate provided over the second electrode;
a scattering layer provided over the substrate;
a reflective polarizing plate provided over the scattering layer;
a quarter wave plate provided over the reflective polarizing plate; and
a polarizing plate provided over the quarter wave plate,
wherein particles each having a different size are dispersed in the scattering layer.

2. An electronic apparatus comprising:
a quarter wave plate provided over a polarizing plate;
a reflective polarizing plate provided over the quarter wave plate;
a scattering layer provided over the reflective polarizing plate;
a substrate provided over the scattering layer;
a thin film transistor comprising a semiconductor film including a source region or a drain region, which is provided over the substrate;
an interlayer insulating film including a contact hole reaching the source region or the drain region, which is provided over the thin film transistor;
a wiring electrically connected to the source region or the drain region, which is provided over the interlayer insulating film;
a first electrode provided over the interlayer insulating film and the wiring;
a light-emitting layer provided over the first electrode; and
a second electrode provided over the light-emitting layer,
wherein particles each having a different size are dispersed in the scattering layer.

3. The electronic apparatus according to any one of claims 1 and 2, wherein a second quarter wave plate is formed between the substrate and the reflective polarizing plate.

4. The electronic apparatus according to any one of claims 1 and 2, wherein the quarter wave plate is a broadband quarter wave plate having an effect as a quarter wave plate in a range of visible light.

5. The electronic apparatus according to any one of claims 1 and 2, wherein the electronic apparatus is one selected from the group consisting of a television, an information terminal device, a camera, and a telephone set.

6. An electronic apparatus comprising:
a light-emitting layer provided over a first electrode;
a second electrode provided over the light-emitting layer,
a substrate provided over the second electrode;
a scattering layer provided over the substrate;
a reflective polarizing plate provided over the transparent substrate scattering layer;
a quarter wave plate provided over the reflective polarizing plate; and
a polarizing plate provided over the quarter wave plate,
wherein particles each having a different refractive index are dispersed in the scattering layer.

7. An electronic apparatus comprising:
a quarter wave plate provided over a polarizing plate;
a reflective polarizing plate provided over the quarter wave plate;
a scattering layer provided over the reflective polarizing plate;
a substrate provided over the reflective polarizing plate scattering layer;
a thin film transistor comprising a semiconductor film including a source region or a drain region, which is provided over the substrate;
an interlayer insulating film including a contact hole reaching the source region or the drain region, which is provided over the thin film transistor;
a wiring electrically connected to the source region or the drain region, which is provided over the interlayer insulating film;
a first electrode provided over the interlayer insulating film and the wiring;
a light-emitting layer provided over the first electrode; and
a second electrode provided over the light-emitting layer,
wherein particles each having a different refractive index are dispersed in the scattering layer.

8. The electronic apparatus according to any one of claims 6 and 7, wherein a second quarter wave plate is formed between the substrate and the reflective polarizing plate.

9. The electronic apparatus according to any one of claims 6 and 7, wherein the quarter wave plate is a broadband quarter wave plate having an effect as a quarter wave plate in a range of visible light.

10. The electronic apparatus according to any one of claims 6 and 7, wherein the electronic apparatus is one selected from the group consisting of a television, an information terminal device, a camera, and a telephone set.

11. The electronic apparatus according to any one of claims 1, 2, 6 and 7, wherein the substrate is a transparent substrate.

12. The electronic apparatus according to any one of claims 1 and 6, wherein the first electrode is a reflective electrode, and the second electrode is a transparent electrode.

13. The electronic apparatus according to any one of claims 2 and 7, wherein the first electrode is a transparent electrode, and the second electrode is a reflective electrode.

* * * * *